(12) United States Patent
Takeda et al.

(10) Patent No.: US 7,848,714 B2
(45) Date of Patent: Dec. 7, 2010

(54) RADIO FREQUENCY CIRCUIT APPARATUS AND RADIO FREQUENCY MODULE

(75) Inventors: Eriko Takeda, Tokyo (JP); Akira Kuriyama, Kokubunji (JP); Tatemi Ido, Kodaira (JP)

(73) Assignee: Hitachi Metals, Ltd., Tokyo (JP)

( * ) Notice: Subject to any disclaimer, the term of this patent is extended or adjusted under 35 U.S.C. 154(b) by 1286 days.

(21) Appl. No.: 11/334,451

(22) Filed: Jan. 19, 2006

(65) Prior Publication Data
US 2006/0250182 A1 Nov. 9, 2006

(30) Foreign Application Priority Data
Apr. 6, 2005 (JP) .............................. 2005-109468

(51) Int. Cl.
*H01Q 11/12* (2006.01)
*H04B 1/04* (2006.01)

(52) U.S. Cl. .................... 455/91; 455/127.1; 455/127.3; 375/295

(58) Field of Classification Search ... 455/127.1–127.5, 455/130, 226.1, 334, 562.1, 95, 91, 101–103, 455/522; 375/135, 146, 295, 299
See application file for complete search history.

(56) References Cited

U.S. PATENT DOCUMENTS

| | | | | |
|---|---|---|---|---|
| 5,973,557 A * | 10/1999 | Miyaji et al. | .................. | 330/51 |
| 6,252,461 B1 * | 6/2001 | Raab | .......................... | 330/302 |
| 6,993,299 B2 * | 1/2006 | Sugar et al. | ................. | 455/103 |
| 7,054,384 B1 * | 5/2006 | Ma et al. | ..................... | 375/299 |
| 7,221,219 B2 * | 5/2007 | Hellberg et al. | ......... | 330/124 R |
| 7,324,481 B2 * | 1/2008 | Kobayashi et al. | ................. | 370/334 |
| 7,411,449 B2 * | 8/2008 | Klingberg et al. | ....... | 330/124 R |
| 7,489,910 B2 * | 2/2009 | Kato et al. | ................... | 455/101 |
| 7,620,420 B2 | 11/2009 | Higuchi et al. | | |
| 2004/0063437 A1 * | 4/2004 | Braun et al. | ................. | 455/450 |
| 2006/0223577 A1 * | 10/2006 | Ouzillou | .................. | 455/553.1 |
| 2006/0270368 A1 * | 11/2006 | Caimi et al. | ................. | 455/129 |
| 2007/0280185 A1 * | 12/2007 | McFarland et al. | ......... | 370/338 |

FOREIGN PATENT DOCUMENTS

| | | |
|---|---|---|
| JP | 2000-286782 | 10/2000 |
| JP | 2001-292067 | 10/2001 |
| JP | 2002-044051 | 2/2002 |
| JP | 2005-064546 | 3/2005 |
| WO | WO 02/099995 | 12/2002 |
| WO | WO 03/103247 | 12/2003 |

* cited by examiner

*Primary Examiner*—Simon D Nguyen
(74) *Attorney, Agent, or Firm*—Antonelli, Terry, Stout & Kraus, LLP.

(57) ABSTRACT

A radio frequency circuit apparatus and a radio frequency module which permit alleviation of the PA efficiency drop and are compatible with both a MIMO system and a conventional system are to be provided. They are provided with a plurality of power amplifiers for amplifying a transmit signal and the plurality of power amplifiers include at least two power amplifiers differing in maximum output power from each other, and at least one out of the plurality of power amplifiers is used according to the communication system.

13 Claims, 28 Drawing Sheets

INPUT POWER

OUTPUT POWER

RADIO FREQUENCY CIRCUIT APPARATUS AND RADIO FREQUENCY MODULE

CLAIM OF PRIORITY

The present application claims priority from Japanese application JP 2005-109468 filed on Apr. 6, 2005, the content of which is hereby incorporated by reference into this application.

FIELD OF THE INVENTION

The present invention relates to a radio frequency circuit apparatus for use in radio communication, and a radio frequency module in which the functions of the radio frequency circuit apparatus are realized as a single component (a module), and more particularly to a radio frequency circuit apparatus and a radio frequency module which can be suitably applied to a MIMO (Multiple Input Multiple Output) system.

BACKGROUND OF THE INVENTION

In radio communication systems such as wireless local area networks (LANs), the feasibility of using a MIMO, which increases the transmission rate by using a plurality of transmitting parts and a plurality of receiving parts in transmitting and receiving data, is under study. The wireless LAN standard currently in the process of standardization (IEEE802.11n) is expected to use a MIMO. An example of radio communication system is disclosed in the Japanese Patent Laid-open No. 2002-44051.

SUMMARY OF THE INVENTION

In the already standardized wireless LAN system, transmission and reception are accomplished with one transmitting part and one receiving part (hereinafter referred to a Single Input Single Output (SISO)) matching the frequency band of signals used in the transmission and reception. In order to extend the communicable distance or to improve the SN ratio (signal-to-noise ratio), it is desirable to transmit a signal with a high power not exceeding the upper limit prescribed by the standard, and to make this possible the transmitting part is provided with a power amplifier (hereinafter abbreviated as PA). The signal amplified by the PA is conveyed to an antenna to accomplish communication.

Examples of configuration of the general RF part in a wireless LAN system for a single band using frequencies in the 2.4-GHz band for instance are shown in FIG. 34 and FIG. 35. Referring to FIG. 34 and FIG. 35, a balanced transmit signal generated by a radio frequency analog IC (hereinafter abbreviated to RF-IC) 118 are turned into an unbalanced transmit signal by a balun 116a, and inputted to a PA 111 via a band pass filter (BPF) 113. The transmit signal power-amplified by the PA 111 are sent to an antenna 117 via a low pass filter (LPF) 114 and a switch (SW) 115. A receive signal received by the antenna 117 are fed to the RF-IC 118 after passing the SW 115 and a band pass filter 119 and being converted into a balanced receive signal by a balun 116b. The difference between FIG. 34 and FIG. 35 consists in that, while a signal is received by a single antenna 117 in the configuration of FIG. 34, two antennas 117a and 117b are used in the configuration of FIG. 35 to make up an antenna-diversity. A conventional single-band wireless LAN would require only one pair of transmitting and receiving parts and only one power amplifier used in the transmit path. A dual-band wireless LAN system, which can use either one of 2.4-GHz and 5-GHz frequency bands by switching over between them, is provided with two pairs of transmitting and receiving parts, one for the 2.4-GHz band and the other for the 5-GHz band.

As stated above, standardization of the next generation standard is now under way to raise the transmission rate of wireless LANs. Under this standard, it is planned to adopt a technology by which a plurality of transmitting/receiving parts and a plurality of antennas are disposed to perform communication (MIMO technology). In MIMO, unlike in conventional SISO, a plurality of circuits shown in FIG. 34, for instance, are arrayed in parallel to constitute transmitting/receiving parts. It has to be noted that, though a plurality of RF-ICs 118 shown in FIG. 34 can be arrayed, it is more desirable to use an RF-IC 118 into which functions of a plurality are integrated into one IC, and it is commonly conceivable to array a plurality of what is shown in a circuit component 120 in FIG. 34. Therefore, it is required in MIMO to use a plurality of PAs, too, for signals containing the same frequency band at least partly. For instance the transmitting part for use in a wireless LAN for the 2.4-GHz band would require a plurality of power amplifiers amplifying the signal of the 2.4-GHz band. In the rest of this specification, where n antennas are required for transmission, an expression of transmission antenna-n will be used and where m antennas are required for reception, an expression of reception antenna-m will be used. In a MIMO system, reception antenna-m $\geq$ transmission antenna-n $\geq$ 2.

When data are to be transmitted by using MIMO technology, a plurality of PAs are required, and the total output of these PAs should be so set as not to surpass the upper limit prescribed by the standard. Therefore, with an increase in the number of antennas used for transmission, the power output from each individual PA should lowered. Thus, the outputs of PAs used in MIMO have to be kept generally lower than those of PAs used in SISO.

The wireless LAN standard to be newly instituted will be required to generally satisfy the existing wireless LAN standards. Therefore, if it is decided to use MIMO technology in the next-generation wireless LAN standard, it will be required to be compatible with the existing wireless LAN standards. In this case, one of the plurality of transmitting parts will be used for wireless LANs conforming to the existing standards.

Now, the general relationship between the output power and the efficiency of a PA is shown in FIG. 36. As shown in this graph, reducing the output power results in a drop in the efficiency of the PA. Therefore, the use of PAs designed to conform to the existing wireless LAN standards in configuring the transmitting parts of a wireless LAN compatible with MIMO would inevitably invite a drop in the efficiency of the PAs.

An object of the present invention is to solve the problems noted above and provide a radio frequency circuit apparatus which is compatible with both a MIMO system and a conventional system and permits alleviation of the PA efficiency drop, and a radio frequency module in which the functions of the radio frequency circuit apparatus are realized as a single component (a module).

A typical example of the invention to achieve the object stated above will be described below. A radio frequency circuit apparatus according to the invention comprises a plurality of power amplifiers for amplifying a transmit signal, wherein the plurality of power amplifiers include at least two power amplifiers differing in maximum output power from each other, and at least one out of the plurality of power amplifiers is used according to a communication system. A radio frequency module according to the invention comprises a plurality of power amplifiers for amplifying a transmit signal, wherein the plurality of power amplifiers are at least two power amplifiers differing in maximum output power from each other. The amplifiers amplify signals at least part of whose frequency band is equal.

The amplifiers different in maximum output power can be obtained by varying the number of stages of transistors constituting the amplifiers, the magnitude of output power when the efficiencies are the same, the magnitude of the maximum saturation power, the magnitude of the maximum linear power, the constituent material, the bias voltages of the power amplifiers, the size of the transistors constituting the power amplifiers, or the value of the load impedance or the like.

For instance, maximum linear output of the first PA included in the radio frequency circuit apparatus or the radio frequency module is so set as to be higher in maximum linear output than that of the second PA by 3 dB. When the radio frequency circuit apparatus or the radio frequency module including the first PA and the second PA is to perform a transmission antenna-2 communication by MIMO, the first PA provides output power which is lower by 3 dB than the power outputted by the first PA in SISO communication. The second PA2 outputs power of a level suitable for MIMO communication. The maximum output power of the first PA is set according to the standard. This results in an efficiency drop of the first PA, that the efficiency of the second PA does not drop, resulting in a restraint on the overall efficiency drop of PAs. When SISO communication is performed, the transmit signal is outputted only from the first PA.

In order to achieve the object stated above, the radio frequency module according to the invention is realized by modularizing the above-described radio frequency circuit apparatus according to the invention into a single component. When the radio frequency module according to the invention performs SISO communication, the transmit signal is inputted only to the first PA, and in the case of MIMO communication, the transmit signal is inputted to the first and second PAs.

Incidentally, "radio frequency circuit apparatus" according to the invention covers at least a transmitting circuit for radio communication, a semiconductor integrated circuit in which the transmitting circuit is formed monolithically over a single semiconductor substrate, a transmitting circuit module in which the transmitting circuit is configured as a single component (a module) by arranging a plurality of semiconductor chip components over a single module substrate, an apparatus in which the transmitting circuit is composed by discretely arranging discrete components over a mother board, and an apparatus having at least one of the above-cited items in a case. It is further evident that the radio frequency circuit apparatus may include a receiving circuit for use in radio communication.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

A radio frequency circuit apparatus for use in radio communication and a radio frequency module in which the functions of the radio frequency circuit apparatus are realized as a single component (a module), both according to the invention, will be described in further detail with reference to a number of preferred embodiments illustrated in drawings. In all the drawings illustrating these preferred embodiments, elements having the same functions will be denoted respectively the same reference signs, and their description will not be repeated.

First Embodiment

Figure 1:
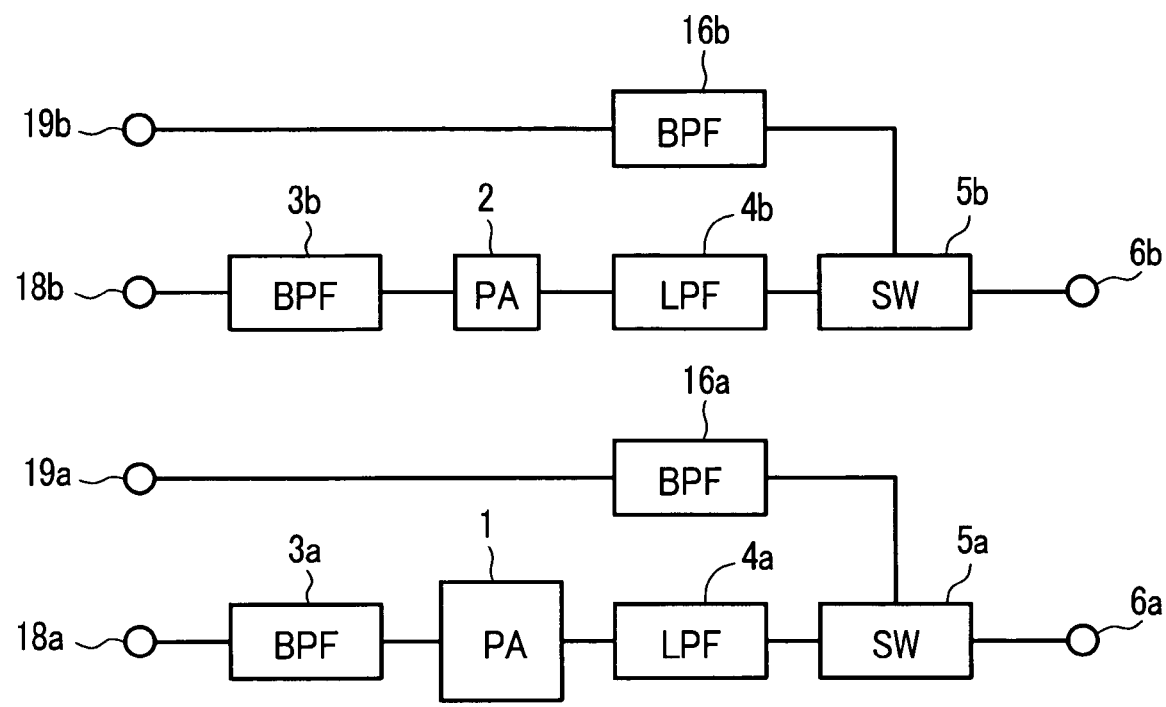
FIG. 1 is a circuit block diagram of a radio frequency circuit apparatus and a radio frequency module, which constitute a first preferred embodiment of the invention.

A first embodiment of the invention will be described with reference to FIG. 1 through FIG. 7B. FIG. 1 is a block diagram showing the configuration of a radio frequency circuit apparatus used in MIMO of transmission antenna-2, which operates in the 2.4-GHz band. The radio frequency circuit apparatus of this embodiment comprises a first PA1, a second PA2, two band pass filters 3a and 3b for a transmit signal, two low pass filters 4a and 4b for the transmit signal, two switches 5a and 5b, and two band pass filters 16a and 16b for a receive signal. In FIG. 1, 18a and 18b denote input terminals for the transmit signal, 19a and 19b, output terminals for the receive signal, and 6a and 6b, antenna terminals.

When a signal is to be transmitted by using the radio frequency circuit apparatus of this embodiment in the MIMO system of transmission antenna-2, the signal is inputted to both the first PA1 and the second PA2. And when SISO communication is to be performed in a conventional wireless LAN environment, only the transmitting part containing the first PA1 (the input terminal 18a to the antenna terminal 6a) and the receiving part paired with it (the antenna terminal 6a to the output terminal 19a) are used, but the transmitting part containing the second PA2 (the input terminal 18b to the antenna terminal 6b) and the receiving part paired with it (the antenna terminal 6b to the output terminal 19b) are not used.

Figure 2A:
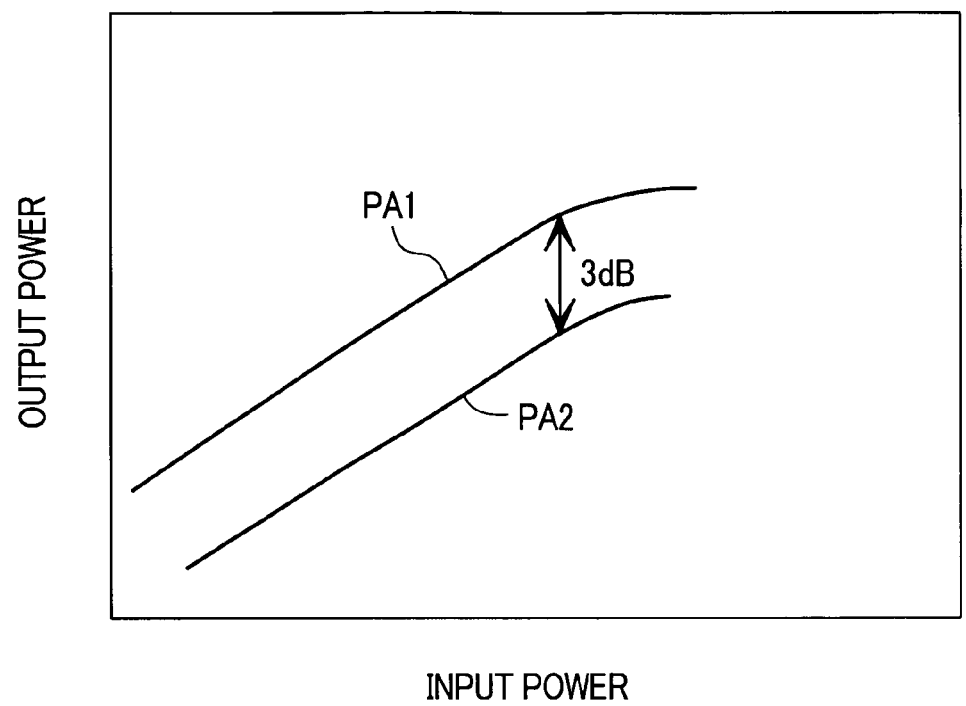
FIG. 2A shows the input-output characteristics of the power amplifiers used in the first embodiment.

The first PA1 and the second PA2 are linear amplifiers. The input-output characteristics of these two PAs are shown in FIG. 2A. The gain of the second PA2 is so designed as to give an output power about 3 dB smaller in the linear region than that of the first PA1 when given the same input power, and thus as to be 3 dB smaller. The first PA1 is so designed as to satisfy not only the upper limit of the transmission power but also other requirements of the wireless LAN standard including, for instance, the permissible level of the error vector magnitude and to output a power which reflects consideration of the loss between the output end of the PA and the antenna. When the first PA1 is to be used for MIMO communication, since both the first PA1 and the second PA2 output power, the output power of the first PA1 is approximately halved. It is advisable to use in this embodiment a variable-gain PA as the first PA1. The first embodiment of the invention is particularly suitable for use in a case in which the magnitude of the signal to be inputted to the power amplifiers for amplifying the transmit signal are the same for both SISO communication and MIMO communication.

Figure 2B:
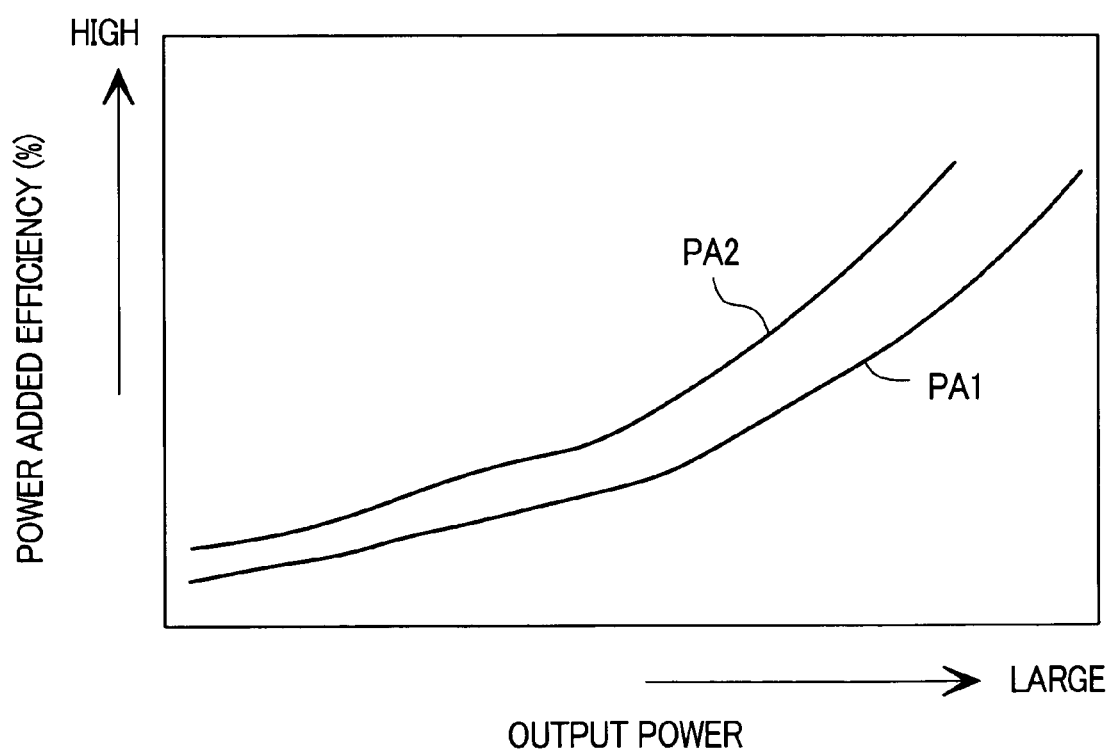
FIG. 2B shows the output power-dependence of the power added efficiency of the power amplifiers used in the first embodiment.

FIG. 2B shows the output power-dependence of the power added efficiency of the first PA1 and the second PA2. As shown in FIG. 2B, when the output power is the same, the second PA2 is more efficient than the first PA1, and can keep a satisfactory level of efficiency when it is to give the same output power as the first PA1. Such a level of efficiency is realized because the maximum output power of the second PA2 is so designed as to be smaller than that of the first PA1 by about 3 dB. In the case where a PA which has the same input-output characteristics as the first PA1 is used as the second PA2, both the first and second PAs will become less efficient. But the overall efficiency drop is reduced as much as the efficiency superiority of the second PA2 in this embodiment. Thus, the configuration of the radio frequency circuit apparatus presented as this embodiment can give a sufficient level of power for SISO communication and reduce the overall efficiency drop of the power amplifier for MIMO communication.

Figure 3:
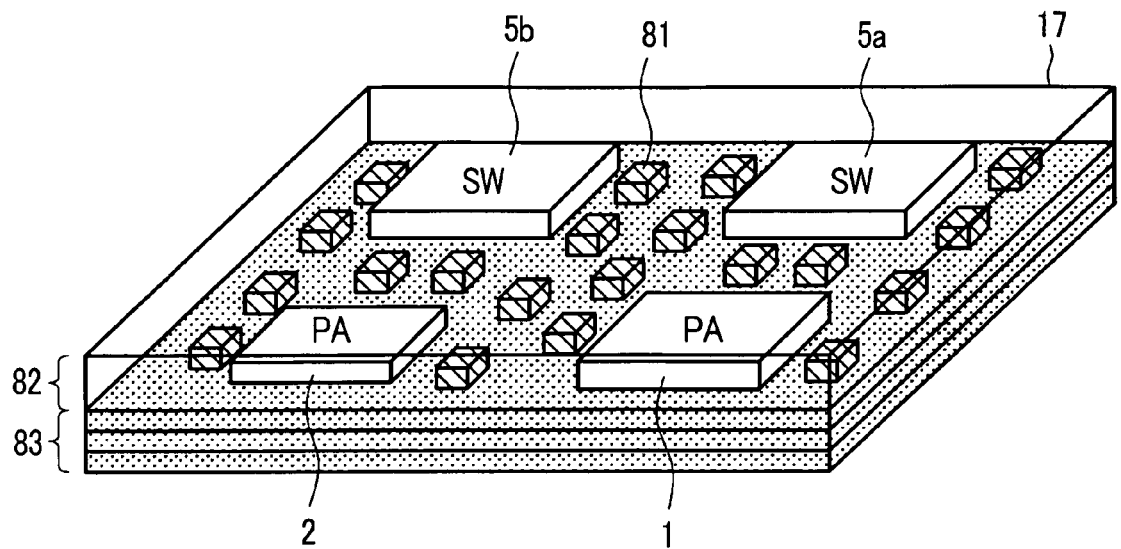
FIG. 3 is a first perspective view for describing the first embodiment.

The radio frequency circuit apparatus of this embodiment may be formed as a radio frequency module 17 as shown in FIG. 3. A multilayer ceramic substrate 83 is used in the radio frequency module 17. The band pass filters 3a, 3b, 16a and 16b and the low pass filters 4a and 4b, among others, are built into the ceramic substrate 83 though not shown in FIG. 3. Though not shown in the drawing either, the antenna terminals for connection to the antennas are disposed on the under side of the ceramic substrate 83 along sides of the substrate. The first PA1, the second PA2 and the switches 5a and 5b, together with chip parts 81, are mounted on the surface of the ceramic substrate 83. The first PA1, the second PA2 and the switches 5a and 5b may as well be mounted as bare chips. Further, the ceramic substrate 83 is covered with a lid 82. In this embodiment, since the filters 3a, 3b, 4a, 4b, 16a and 16b are integrated inside the multilayer ceramic substrate 83, the radio frequency module 17 can be made compact.

Figure 4:
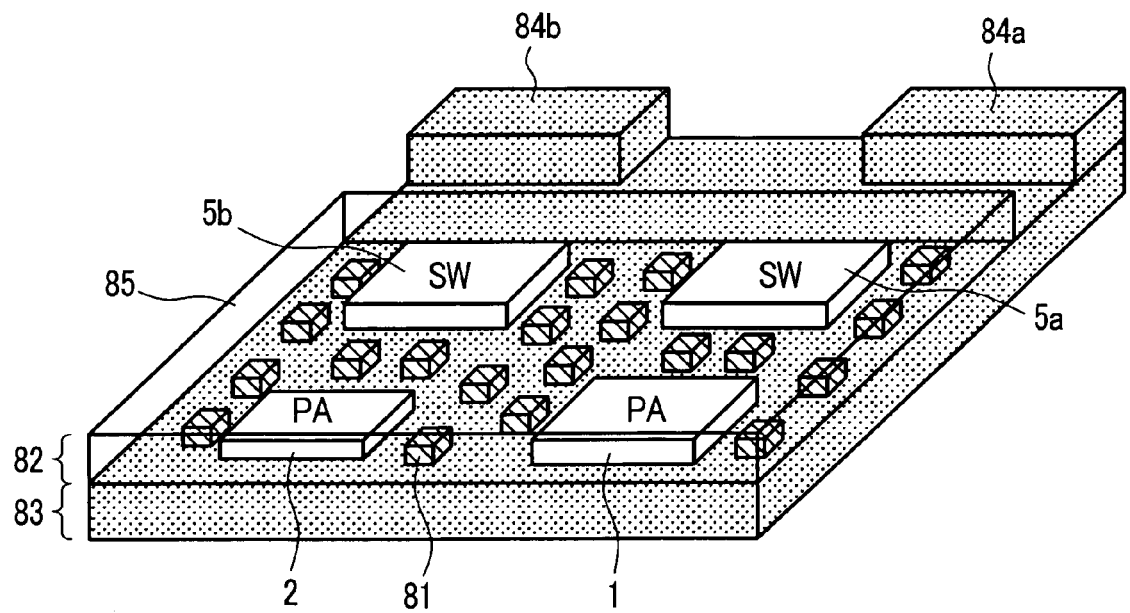
FIG. 4 is a second perspective view for describing the first embodiment.

Other conceivable structures of the radio frequency module 85 is shown in FIG. 4. The mounting area of the radio frequency module 85 is larger than that of the ceramic substrate 83 used in the radio frequency module 17 shown in FIG. 3, with additional integration of ceramic antennas 84a and 84b. The ceramic antennas 84a and 84b may as well be formed together with the radio frequency module shown in FIG. 3.

Figure 5:
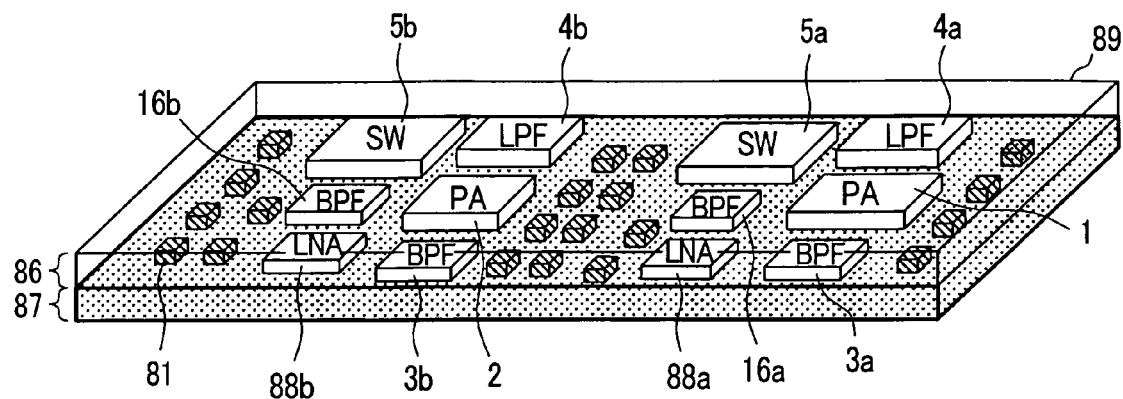
FIG. 5 is a third perspective view for describing the first embodiment.

Still another structure of the radio frequency module is a radio frequency module 89 shown in FIG. 5. The radio frequency module 89 is formed by using a resin board 87. This module uses discrete components as low noise amplifiers (LNA) 88a and 88b for reception use and the band pass filters 16a, 16b, and they are mounted over the resin board 87 together with other components. Obviously, components that can be integrated inside the resin board 87 can be so integrated instead of being mounted over the resin board 87.

Figure 6:
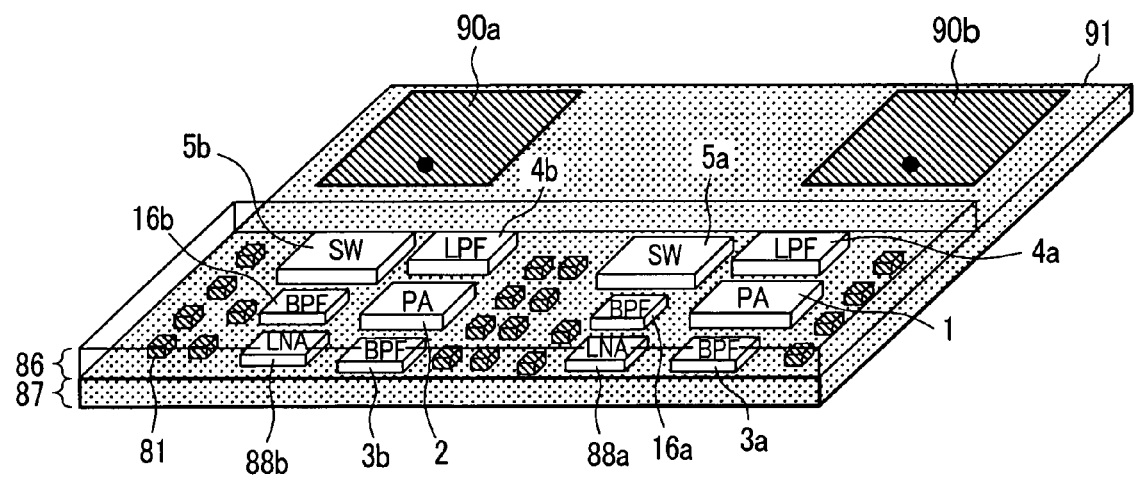
FIG. 6 is a fourth perspective view for describing the first embodiment.

Like the radio frequency module 85 shown in FIG. 4, it is also conceivable to configure a radio frequency module 91 by forming antennas 90a and 90b over the resin board 87 as shown in FIG. 6 and form the radio frequency module 89 shown in FIG. 5. By providing such a radio frequency module 91, the module user's trouble designing the radio frequency circuit and mounting the components can be saved.

Figure 7A:
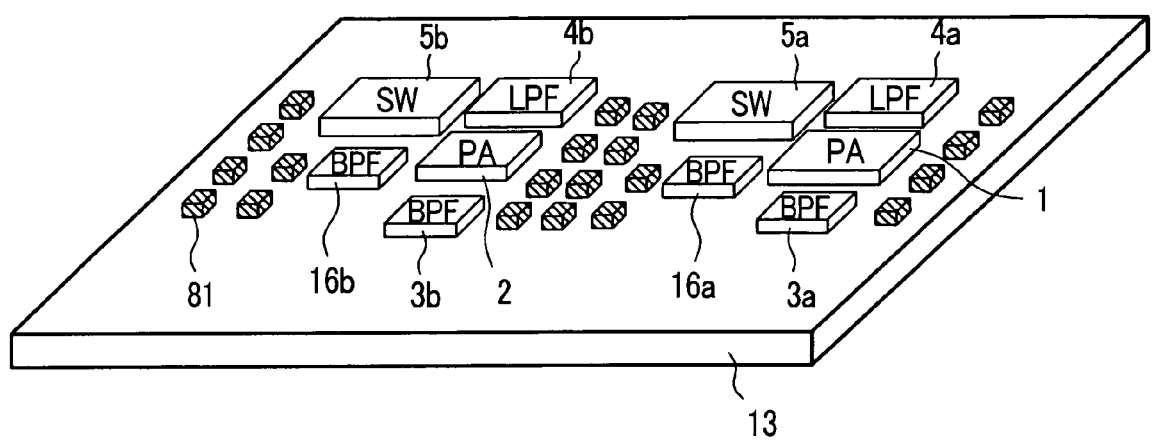
FIG. 7A is a fifth perspective view for describing the first embodiment.
Figure 7B:
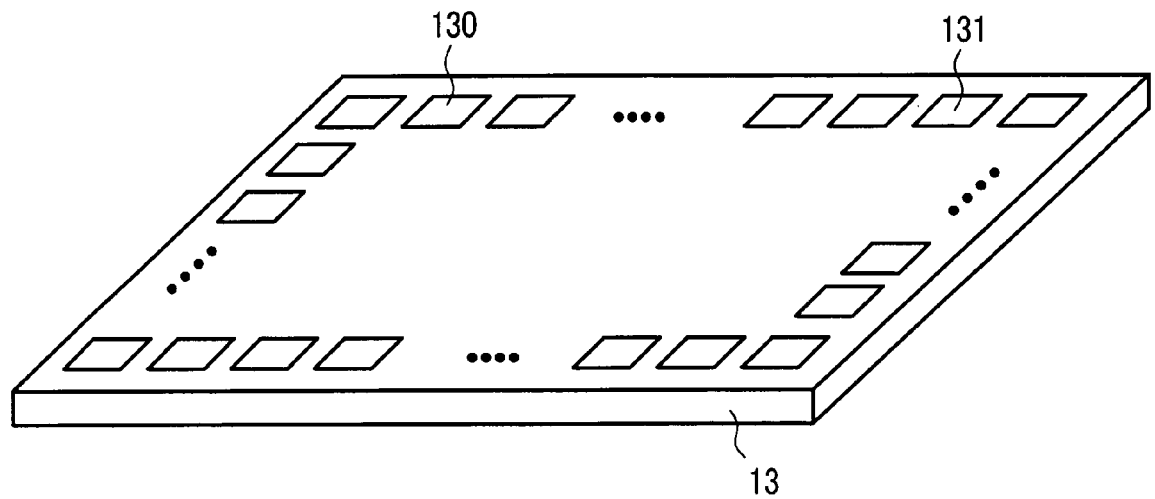
FIG. 7B is a sixth perspective view for describing the first embodiment.

It is obviously conceivable to configure the radio frequency circuit apparatus shown in FIG. 1 by arranging discrete components over a substrate 13, which is to serve as the mother board as shown in FIG. 7A instead of making a module. It is desirable for the substrate to be rectangularly shaped because of the relative ease of its formation. The rear face of the substrate 13 of FIG. 7A is shown in FIG. 7B. It is desirable to arrange the antenna terminals shown in FIG. 1 along one side of the substrate 13 as shown in FIG. 7B for the purpose of the ease of arranging the wiring for antenna connection. Terminals 130 in FIG. 7B are intended for electrical connection to the first PA1, and terminals 131, for electrical connection to the second PA2.

In the following description of other embodiments, the radio frequency circuit apparatus and the radio frequency module according to the invention will be described in terms of the configuration of the radio frequency module, but the mounting of the module and the substrate used as respectively the same as described above, their description will be dispensed with. Obviously, as in the first embodiment, the radio frequency circuit apparatus can as well be formed by arranging discrete components over a substrate, such as a mother board, instead of making a module.

Second Embodiment

Figure 8:
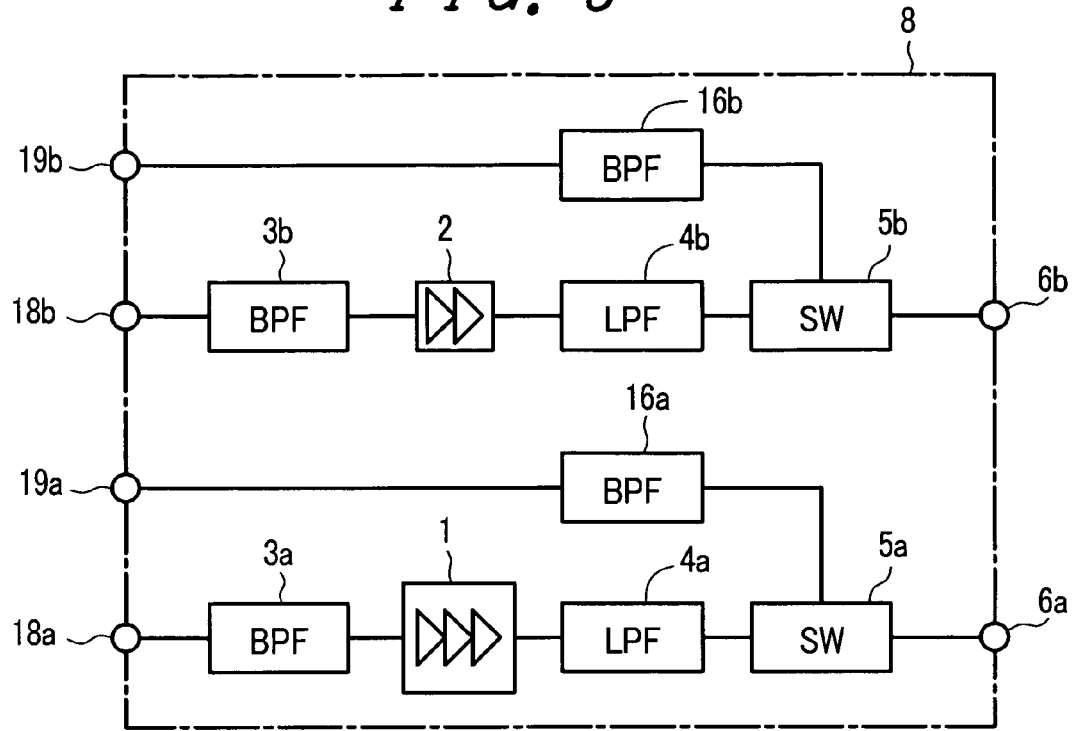
FIG. 8 is a circuit block diagram for describing a second preferred embodiment of the invention.

A second embodiment of the present invention will now be described with reference to FIG. 8. FIG. 8 is a block diagram showing the circuit configuration of a radio frequency module 8 for MIMO of transmission antenna-2, which, like the first preferred embodiment, operates in the 2.4-GHz band. This second embodiment of the invention is particularly suitable for use where the magnitude of the signal inputted to the power amplifier for amplifying the transmit signal is the same both in SISO communication and in MIMO communication. In this embodiment, the first PA1 is a three-stage amplifier consisting of three stages of cascade-connected transistors mainly formed of gallium arsenide (GaAs) and the second PA2, a two-stage amplifier consisting of two stages of cascade-connected transistors mainly formed of GaAs. The total gain of the second PA2 is so designed as to be 3 dB less and the maximum output power in the linear region also is so designed as to be smaller by about 3 dB by reducing the stages of transistors than those of the first PA1.

In the second embodiment, too, its configuration in which maximum output power of the PA used only in MIMO communication is smaller than that of the PA used in both MIMO and SISO communication enables sufficient power to be supplied for SISO communication and at the time to enable the overall efficiency drop of the power amplifier for MIMO communication to be reduced.

Third Embodiment

Figure 9:
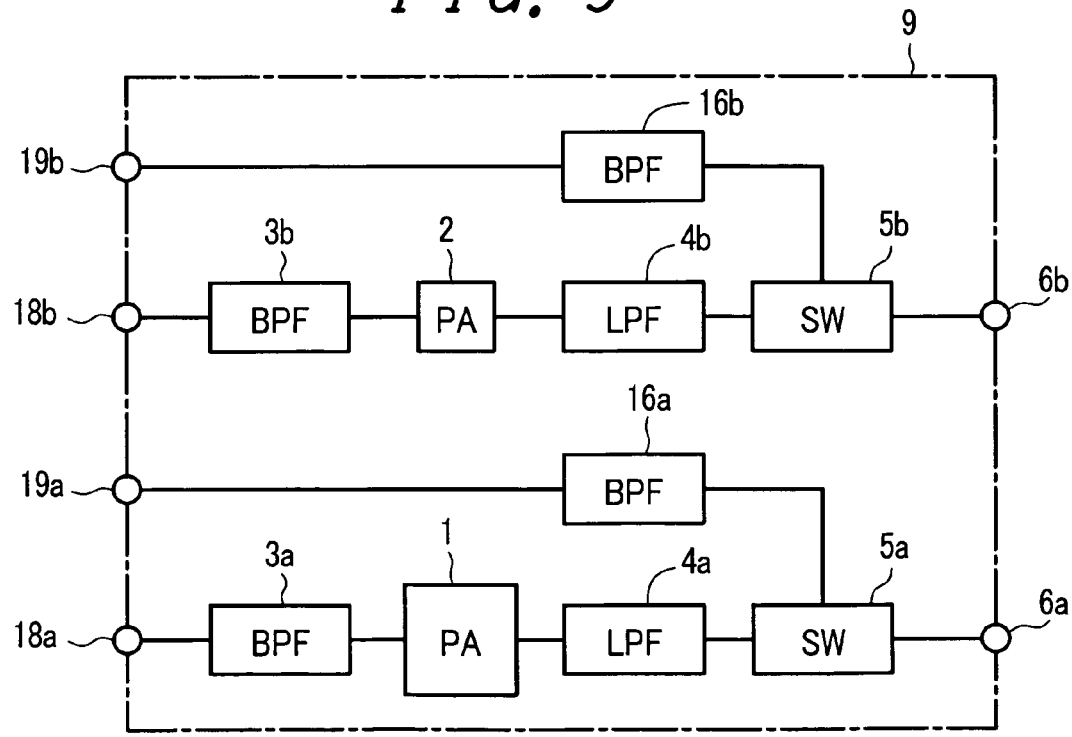
FIG. 9 is a circuit block diagram for describing a third preferred embodiment of the invention.

A third embodiment of the present invention will now be described with reference to FIG. 9. FIG. 9 is a block diagram showing the circuit configuration of a radio frequency module 9 for MIMO using two transmission antennas, which operates in the 2.4-GHz band. The difference of this embodiment from the second embodiment consists in that, though the first PA1 is fabricated mainly of GaAs like that in the second embodiment, the second PA2 is formed mainly of silicon (Si). The total gain of the second PA2 is so designed as to be 3 dB less and also the maximum output power in the linear region is so designed as to be smaller by about 3 dB than those of the first PA1. The way in which the first PA1 and the second PA2 are used and the effects they provide are the same as in the embodiments described above. A further advantage of this embodiment is that by configuring the radio frequency module by using an inexpensive PA mainly consisting of Si, the cost of the radio frequency module can be kept lower than a radio frequency module of which both the first PA1 and the second PA2 are made of GaAs.

Fourth Embodiment

Figure 10:
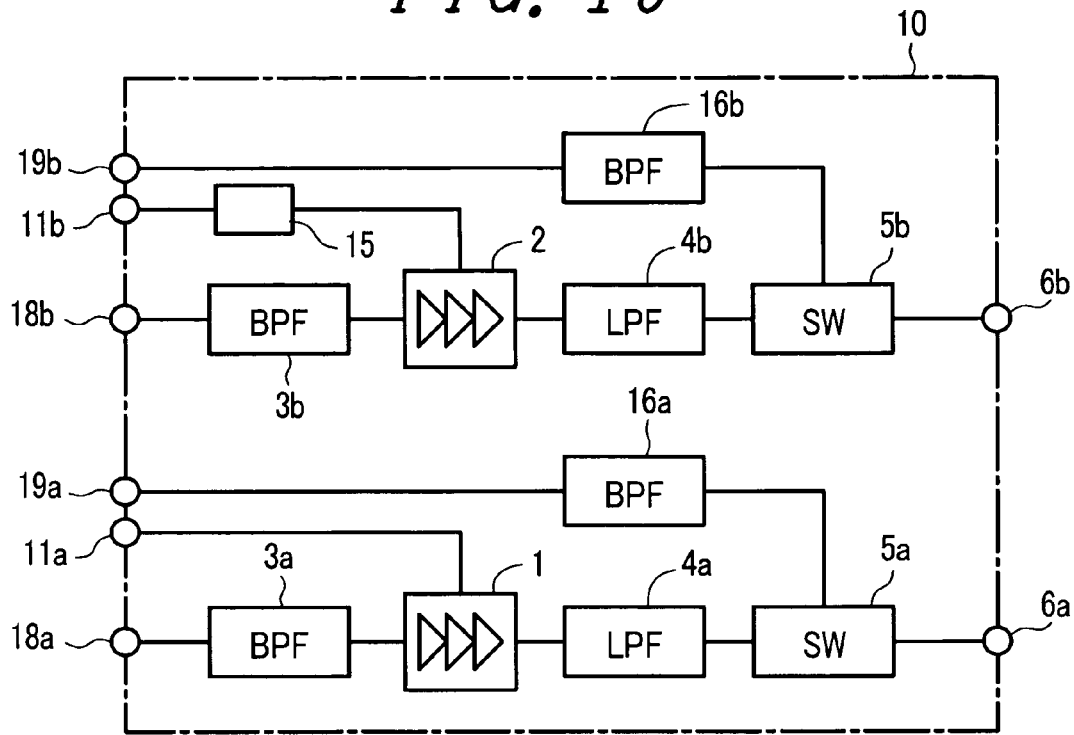
FIG. 10 is a circuit block diagram for describing a fourth preferred embodiment of the invention.

A fourth embodiment of the present invention will now be described with reference to FIG. 10. FIG. 10 is a block diagram showing the circuit configuration of a radio frequency module 10 for MIMO of transmission antenna-2, which, like the second preferred embodiment, operates in the 2.4-GHz band. The first PA1 and the second PA2 are of the same design and, if the conditions of driving are equal, will show substantially the same characteristics in terms of output power, gain and so on. In this embodiment, a bias voltage is supplied from the biasing terminal 11a of the first PA1. Further, the biasing circuit of the second PA2 is provided with a DC-DC converter 15 having a biasing terminal 11b, and a lower bias voltage than what is supplied to the first PA1 is supplied to the second PA2 from the DC-DC converter 15. In this embodiment a voltage of about 3.3 V is supplied to the first PA1, and one of about 2.3 V to the second PA2. When the bias voltage of the second PA2 is lowered, the gain remains almost the same but the saturation output drops to bring down the maximum output power in the linear region. Power consumption by the radio frequency module 10 can be saved by reducing the bias voltage. The use of a configuration shown in this mode of implementing the invention for the radio frequency module 10 makes it possible to reduce the overall power consumption of the module. A unique advantage of this embodiment is that, while the second and third embodiments use PAs differing type from each other, PAs of the same type are used and accordingly the variety of PAs required for the fabrication of the radio frequency module 10 for use in MIMO can be reduced, resulting in simplification of the procurement and management of components. Further, this fourth embodiment is suitable for cases in which the magnitude of the signal inputted to power amplifiers is made smaller in advance according to the number of antennas used in MIMO communication than in SISO communication.

Fifth Embodiment

Figure 11:
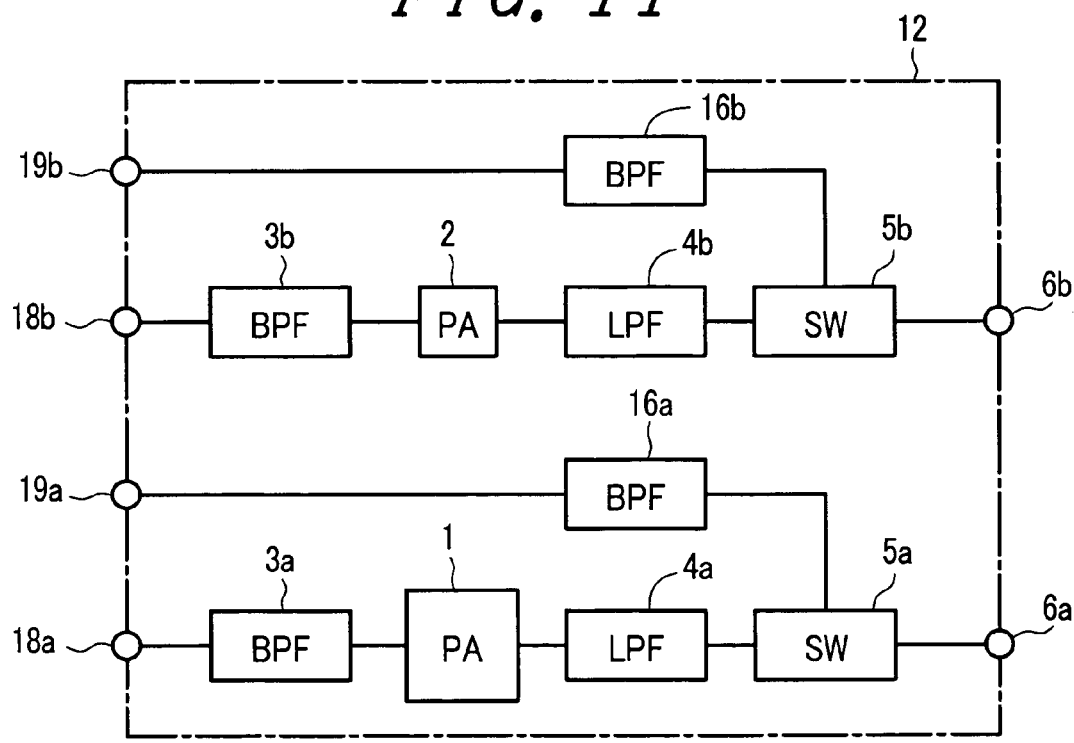
FIG. 11 is a circuit block diagram for describing a fifth preferred embodiment of the invention.

A fifth embodiment of the present invention will now be described with reference to FIG. 11. FIG. 11 is a block diagram showing the circuit configuration of a radio frequency module 12 for MIMO of transmission antenna-2, which, like the second preferred embodiment, operates in the 2.4-GHz band. The first PA1 and the second PA2 of this embodiment are power amplifiers using GaAs heterojunction bipolar transistors (HBT). In this embodiment, the number of fingers of the final stage of the second PA2 is half as large as the number of fingers of the final stage of the first PA. Thus in this embodiment, the maximum output power of the second PA2 is kept smaller by reducing the number of transistor fingers. The advantages of this embodiment are the same as those of the embodiments described earlier. As a unique feature of this embodiment, the chip area required for the fabrication of one PA can be made smaller by reducing the number of transistor fingers of the second PA2, with the result that the cost of the radio frequency module 12 can be reduced. Further, a radio frequency module equipped with power amplifiers out of which gate width of the second PA2 is made narrower than that of the first PA1 can evidently provide the same advantage.

Sixth Embodiment

Figure 12:
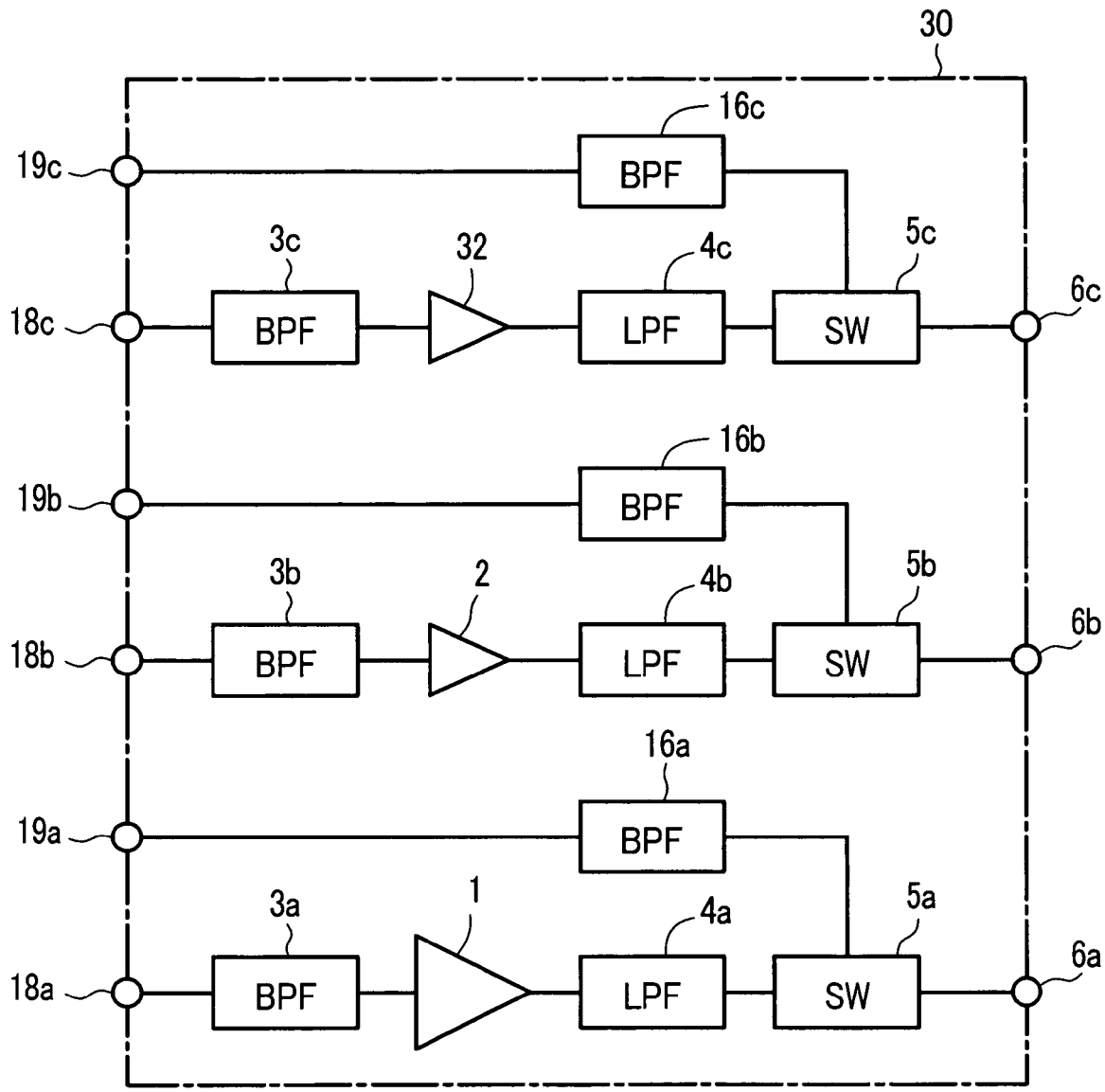
FIG. 12 is a circuit block diagram for describing a sixth preferred embodiment of the invention.

A sixth embodiment of the present invention will now be described with reference to FIG. 12. FIG. 12 is a block diagram showing the circuit configuration of a radio frequency module 30 for MIMO of transmission antennas-3, which operates in the 2.4-GHz band. This module comprises the first PA1, the second PA2, a third PA 32, three band pass filters 3a through 3c for the transmit signal, three low pass filters 4a through 4c for the transmit signal, three band pass filters 16a through 16c for the receive signal and three switches 5a through 5c. It is further provided with three input terminals 18a through 18c for the transmit signal, three output terminals 19a through 19c for the receive signal and three antenna terminals 6a through 6c.

When the radio frequency module 30 is to be used in a MIMO system wherein the other party in communication has equal or more reception antenna-number than reception antenna-3, the transmit signal is inputted at the time of transmission to the transmitting parts comprising the first PA1, the second PA2 and the third PA 32 respectively. Further, when SISO communication is to be performed in a conventional wireless LAN system, the transmit signal is inputted at the time of transmission to the transmitting part in which the first PA1 is included. Or when the other party in communication is of reception antennas-2, the transmit signal is inputted to the transmitting parts which include the first PA1 and the second PA2 respectively in this embodiment.

Figure 13:
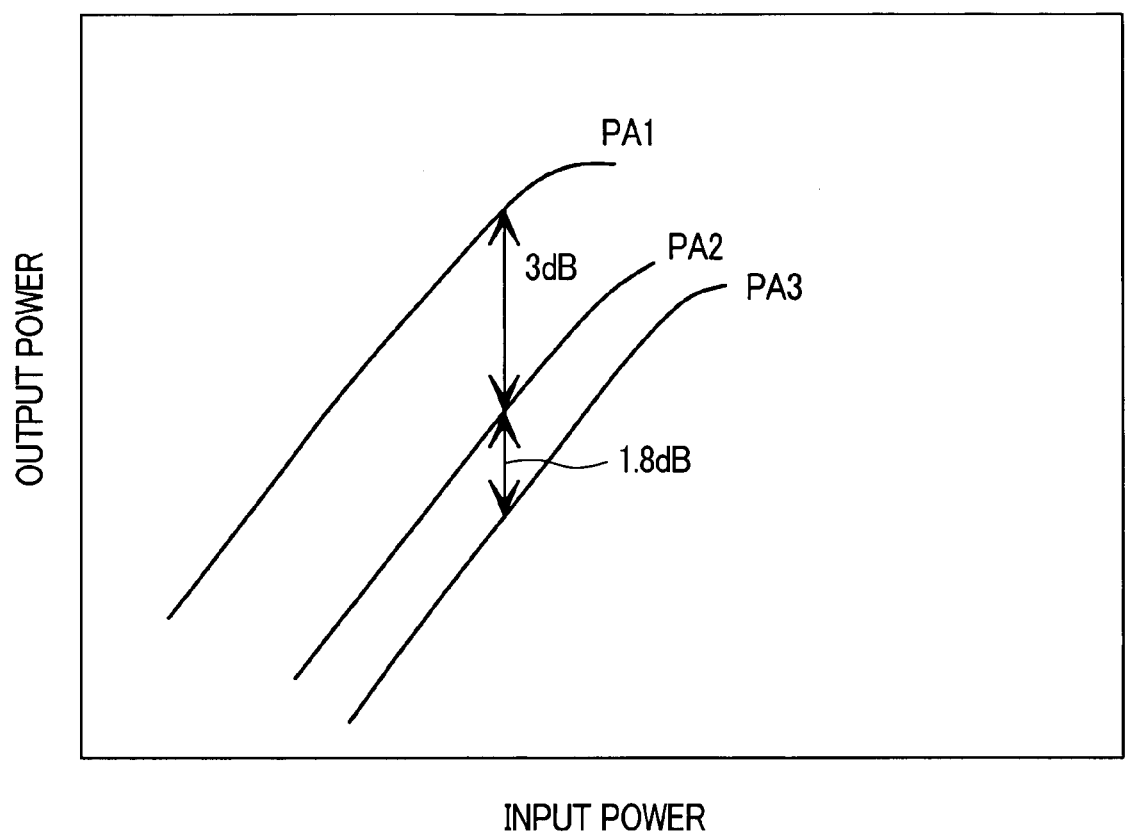
FIG. 13 shows the input-output characteristics of the power amplifiers used in the sixth embodiment.

In the radio frequency module of this embodiment, linear amplifiers fabricated mainly of GaAs are used as the first PA1, the second PA2 and the third PA 32. The input-output characteristics of these three PAs are shown in FIG. 13. The output power in the linear region of the second PA2 is designed to be about 3 dB lower than that of the first PA1 when given the same input power. Also, the output power in the linear region of the third PA 32 is designed to be about 1.8 dB lower than that of the second PA2 when given the same input power. The first PA1 is designed to meet the conventional wireless LAN standard and to output a power which reflects consideration of the loss between the output end of the PA and the antenna.

In this embodiment, too, the PAs and the power outputted from each of them vary with the number of antennas of the other party in communication. When transmission is to be performed with transmission antenna-2, the output power of each PA is lower by about 3 dB than the output power in SISO. When transmission is to be performed with transmission antenna-3, the output power of each PA is lower by about 4.8 dB than the output power in SISO. In this embodiment, the first PA1 is designed to be able to output required power for SISO communication, the second PA2 to output required power for communication of transmission antenna-2, and the third PA 32, to output required power for communication of transmission antenna-3. Therefore, compared with the conventional case in which the radio frequency module for MIMO use is formed of PAs of which every one is the same as the first PA1, the drop in the efficiency of PAs can be reduced. As this embodiment evidences, in the radio frequency module for MIMO which is composed to be compatible with transmission antenna-3, configuring the PAs used only in MIMO communication to be lower in maximum output power than the PA for use in both MIMO and SISO communication makes it possible to output with a sufficient power for SISO communication, and where MIMO communication is to be performed with transmission antenna-2 and transmission antenna-3, the overall efficiency drop of the power amplifies can be reduced to make available a high-efficiency radio frequency module for MIMO use.

Figure 14A:
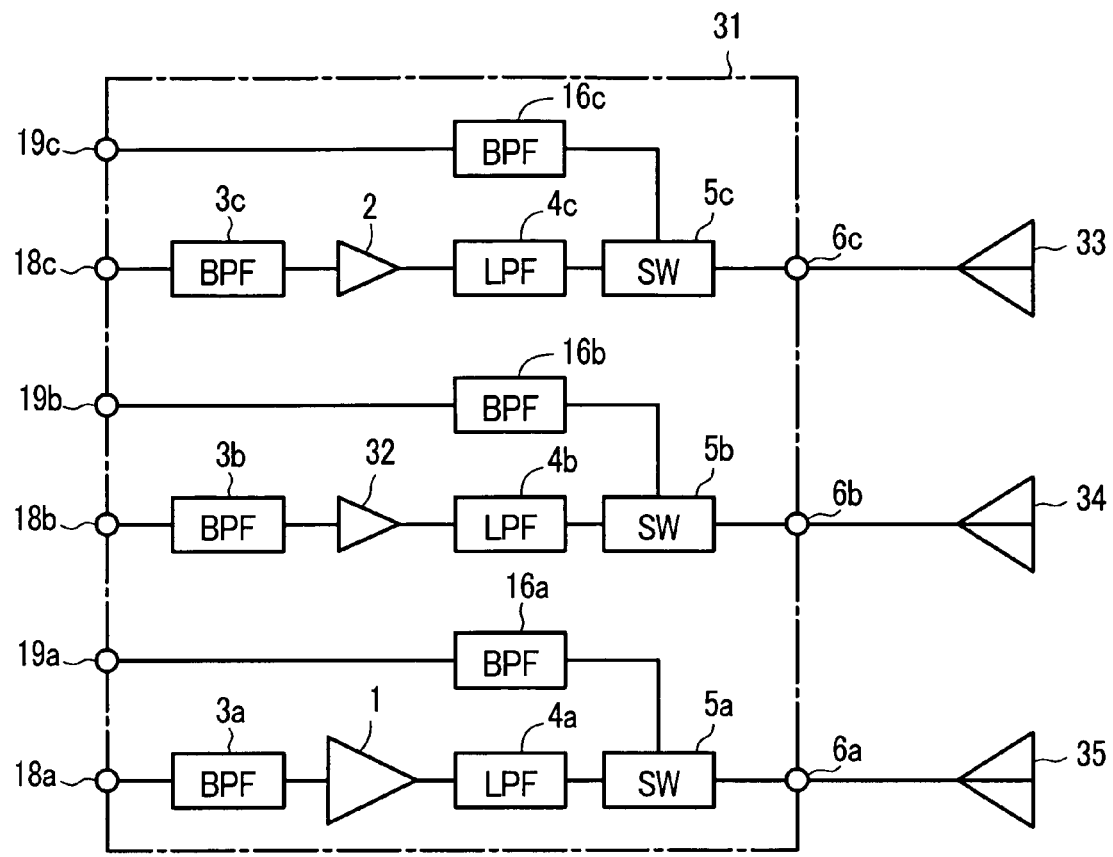
FIG. 14A is another circuit block diagram of the sixth embodiment.
Figure 14B:
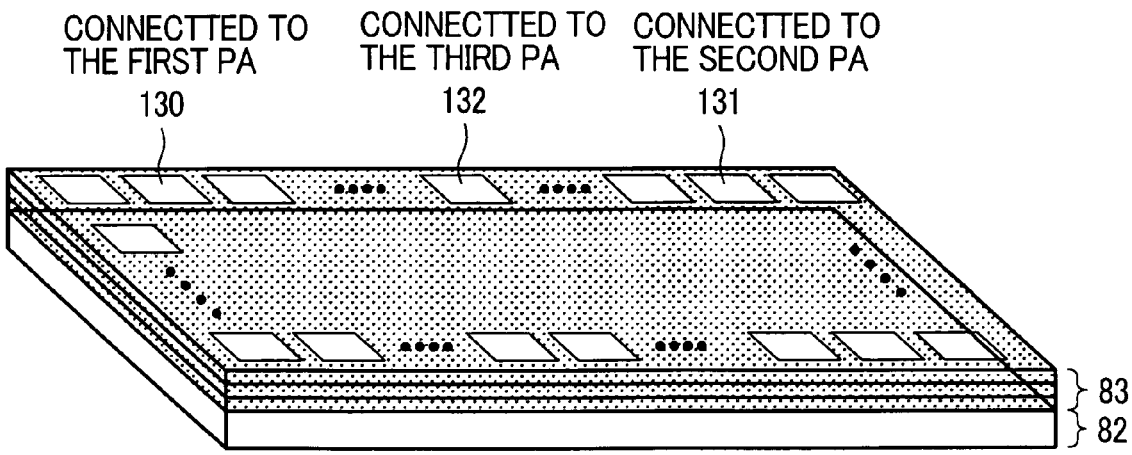
FIG. 14B is a perspective view of the sixth embodiment.

Next, a desirable way of arranging a plurality of PAs in, a radio frequency module 31 of this embodiment will be described with reference to FIG. 14A. The PA or PAs used in this embodiment described above is the first PA1 in SISO and are the first PA1 and the second PA2 in the case of transmission antenna-2. In MIMO, the greatest MIMO effect can be achieved when the used antennas can be deemed to have no correlation each other. Therefore, it is desirable to arrange the antennas as far apart as practicable from one another. Accordingly, when the radio frequency module 31 for MIMO is used as transmission antenna-2, it is desirable to so arrange an antenna 33 and an antenna 35 as to have an antenna 34 between them as shown in FIG. 14A and perform communication. In this case, in order to arrange wirings from the radio frequency module 31 to the antennas 33, 34 and 35 without allowing them to cross each other, it is desirable to connect the first PA1 and the second PA2 used in the case of transmission antenna-2 to the antennas 35 and 33, respectively, and this necessitates arrangement of the transmitting/receiving parts containing the first PA1 and the second PA2 in the transmitting parts at two ends of the module. Further, the desirable arrangement of terminals provided for that purpose to connect the first through third PAs to antennas via switches will be described with reference to FIG. 14B. FIG. 14B shows the rear face of the radio frequency module of this embodiment, with its face mounted with PAs and switches being supposed to be the front face. Terminals for connection to antennas are disposed along one side of the rectangular module, of which terminals 130, 131 and 132 shown in FIG. 14B are the terminals to connect the first through third PAs and the antennas, with the terminal 130 being electrically connected to the first PA1, the terminal 131 to the second PA2 and the terminal 132 to the third PA. In this embodiment, the terminal 130 and the terminal 131 are arranged to be farthest from each other among the terminals 130, 131 and 132. By arranging the terminals 130, 131 and 132 in this way, it is made possible to wire without allowing them to cross each other in the radio frequency module or allowing the wirings between the radio frequency module and the antennas to cross each other.

This configuration makes it possible to achieve a higher MIMO effect than that is achieved by the arrangement shown in FIG. 12. It is also evident that a similar effect can be achieved in the radio frequency circuit apparatus by such an arrangement of terminals.

Seventh Embodiment

Figure 15:
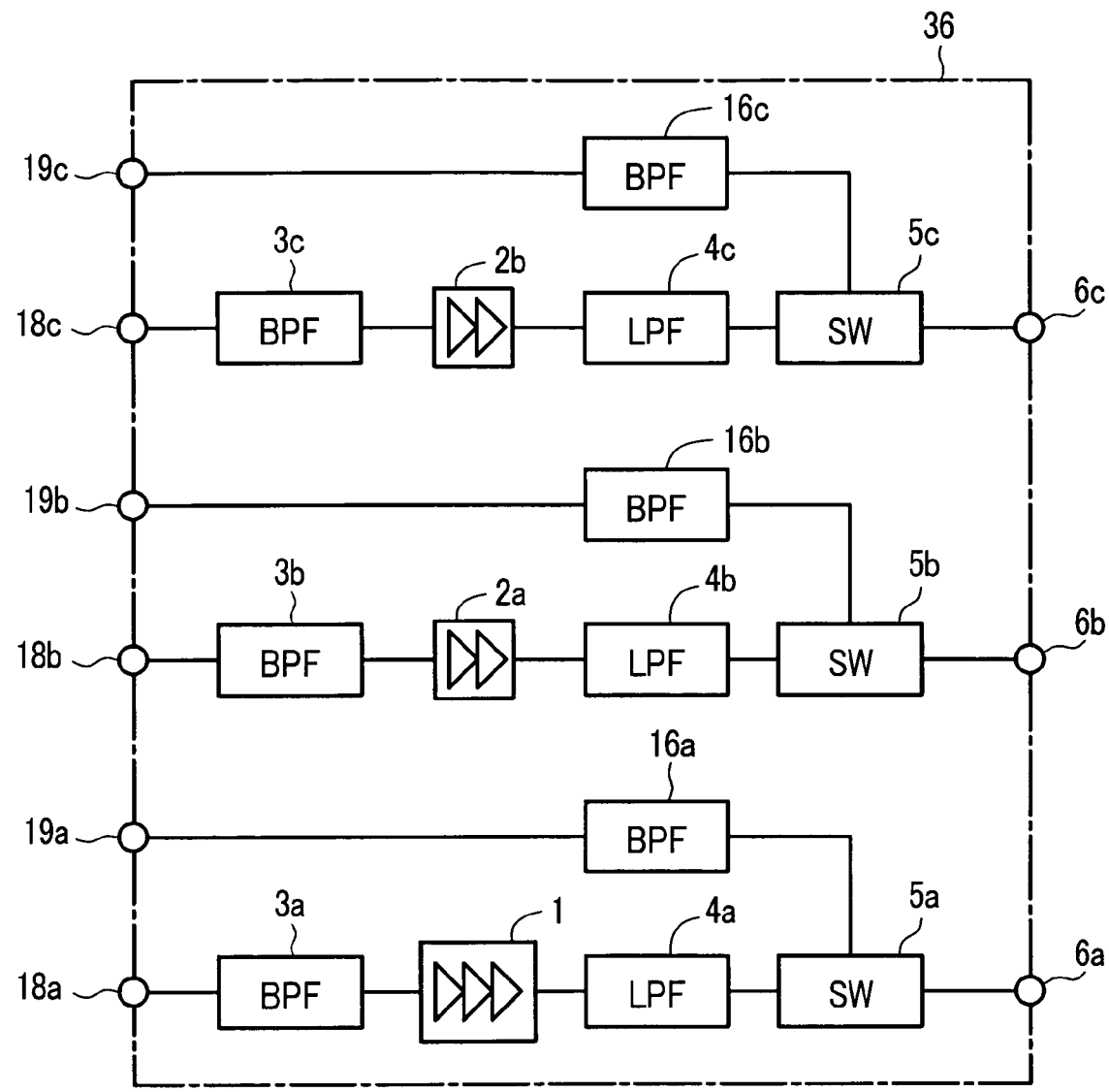
FIG. 15 is a circuit block diagram of a seventh preferred embodiment of the invention.

A seventh embodiment of the present invention will now be described with reference to FIG. 15. FIG. 15 is a block diagram showing the circuit configuration of a radio frequency module 36 for MIMO of transmission antenna-3, which operates in the 2.4-GHz band. This module comprises the first PA1, two second PA2a and PA2b, three band pass filters 3a through 3c for the transmit signal, three low pass filters 4a through 4c for the transmit signal, three band pass filters 16a through 16c for the receive signal and three switches 5a through 5c. In this embodiment, transistor sizes of the second PA2a and the second PA2b are substantially equal.

In a MIMO system in which the number of antennas is three for both transmission and reception, the first PA1 and two second PA2a and PA2b are used, and the transmit signal is inputted to the transmitting parts containing them respectively. When SISO communication is to be performed in a conventional wireless LAN environment, the transmit signal is inputted at the time of transmission only in the transmitting part containing the first PA1. When the first PA1 in this embodiment is to be used in MIMO communication, the number of amplifying stages of power amplifier can be smaller than when it is used in SISO communication. The method of altering the number of amplifying stages of power amplifier will be described with reference to a subsequent embodiment of the invention.

Incidentally, this embodiment, when the other party in communication is of reception antenna-2, unlike in a case in the sixth embodiment described above, the transmit signal is not inputted at the time of transmission to the transmitting part containing the first PA1, but the transmit signal is inputted to the two transmitting parts containing the second PA2a and PA2b. Thus, the first PA1 is in an OFF state. In the case of the sixth embodiment, when in use with transmission antenna-2, the PA efficiency drops as the first PA1 is used at a reduced output, but the configuration of this embodiment can prevent the overall efficiency of PAs from dropping when in use with transmission antenna-2.

Furthermore, as this embodiment enables the variety of PAs required for configuring a radio frequency module by one type compared with sixth embodiment, the variety of PAs needed for assembly can be reduced, and this contributes to simplification of the procurement and management of components.

When in use with transmission antenna-3, one of the second PA2a and PA2b in this embodiment is less efficient than its counterpart in the sixth embodiment described above, but the output difference between the third PA 32 used in sixth embodiment and the second PA2 used in the seventh embodiment in place of the third PA 32 is only about 1.8 dB, and thus the drop in efficiency can be kept small.

Figure 16:
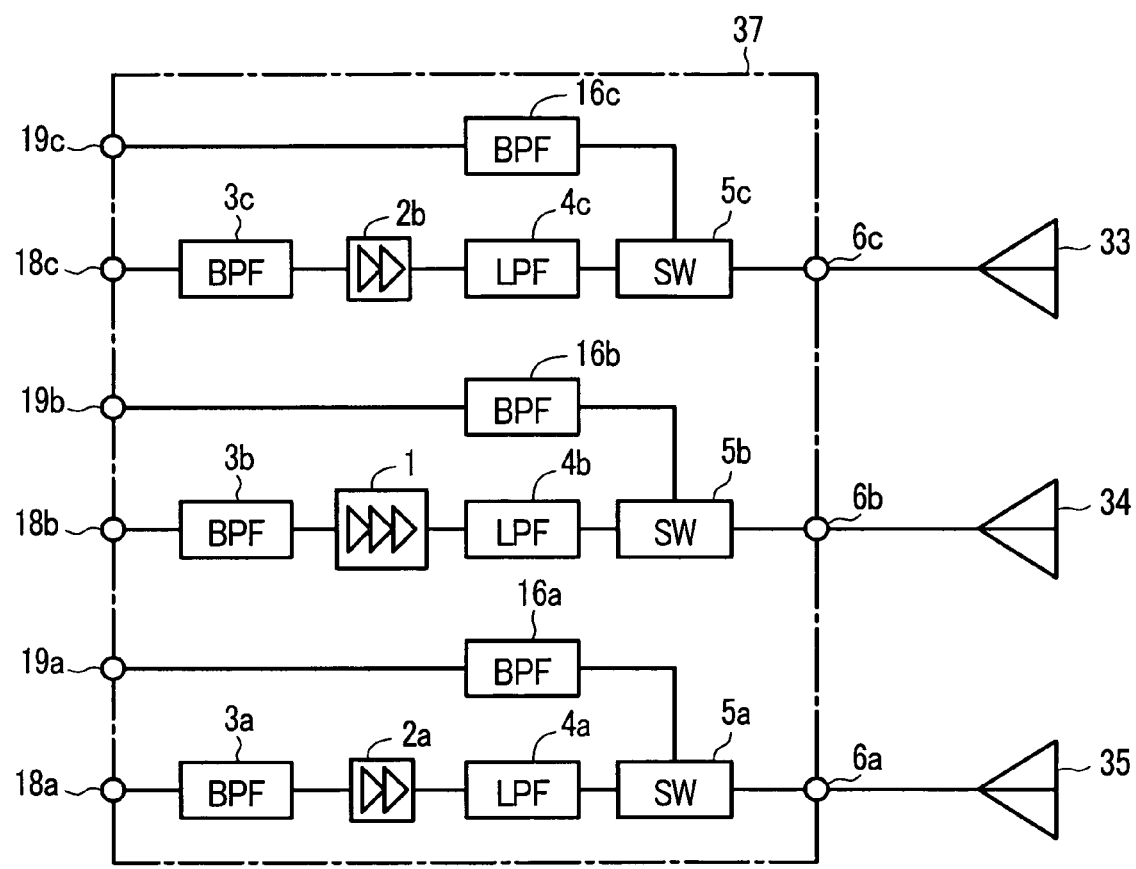
FIG. 16 is a circuit block diagram of the seventh embodiment.

Next, a desirable way of arranging the plurality of PAs in this embodiment will be described with reference to FIG. 16. In this embodiment, when in SISO use, the signal is inputted to the first PA1 and, in the case of transmission antenna-2, the signal is inputted to the two second PA2a and PA2b. It is desirable then for the transmitting/receiving parts containing the two second PA2a and PA2b in the transmitting parts to be arranged at the two ends of the module as shown in FIG. 16. This arrangement would make it possible to achieve a higher MIMO effect than the arrangement shown in FIG. 15. Further, as the first PA1 providing the largest maximum output power is arranged near the center of the module in the arrangement shown in FIG. 16, the heat generated by the first PA1 can be diffused all over a radio frequency module 37 for MIMO use. Therefore, it is made possible to suppress the rise in module temperature due to heat generation by the first PA1.

Figure 17A:
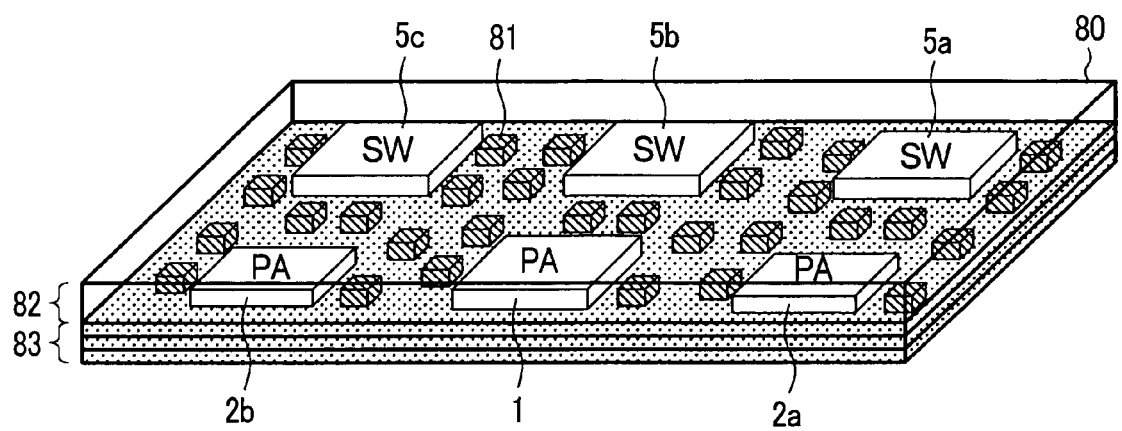
FIG. 17A is a perspective view of the seventh embodiment.
Figure 17B:
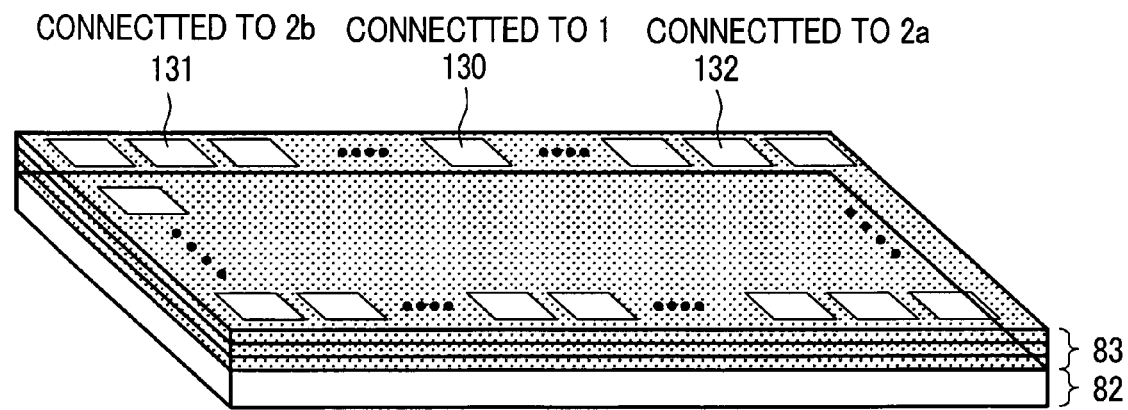
FIG. 17B is another perspective view of the seventh embodiment.

An example of radio frequency module having the arrangement shown in FIG. 16 is illustrated in FIG. 17A. Though not shown in FIG. 17A, the band pass filters 3a, 3b, 3c, 16a, 16b and 16c and the low pass filters 4a, 4b and 4c and the like are built into the ceramic substrate 83 of a radio frequency module 80. The first PA1 and the switch 5b are mounted at the center of the surface of the substrate 83, and the second PA2a and the switch 5a and the second PA2b and the switch 5c are respectively mounted on the two sides of the surface. The chip parts 81 are also mounted on the surface together with these elements. The top of the ceramic substrate 83 is covered with the lid 82. A desirable arrangement of terminals provided for that purpose to connect the first through third PAs to antennas via switches in this embodiment will be described with reference to FIG. 17B. FIG. 17B shows the rear face of the radio frequency module shown in FIG. 17A. Terminals for connection to antennas are disposed along one side of a rectangular module. Of these terminals, the terminals 130, 131 and 132 shown in FIG. 17B are intended to connect the first PA1, the second PA2a and the second PA2b to the antennas, with the terminal 130 being electrically connected to the first PA1, the terminal 131 to the second PA2a and the terminal 132 to the second PA2b. This arrangement makes it possible to wire without allowing them to cross one another in the radio frequency module or allowing the wirings between the radio frequency module and the antennas to cross one another. In this embodiment, the terminal 130 electrically connected to the first PA1 having the maximum output power is so arranged as to come between the second PA2a and the terminal electrically connected to the second PA2b. A similar effect can also be achieved in the radio frequency circuit apparatus by arranging terminals in this way.

Eighth Embodiment

Figure 18:
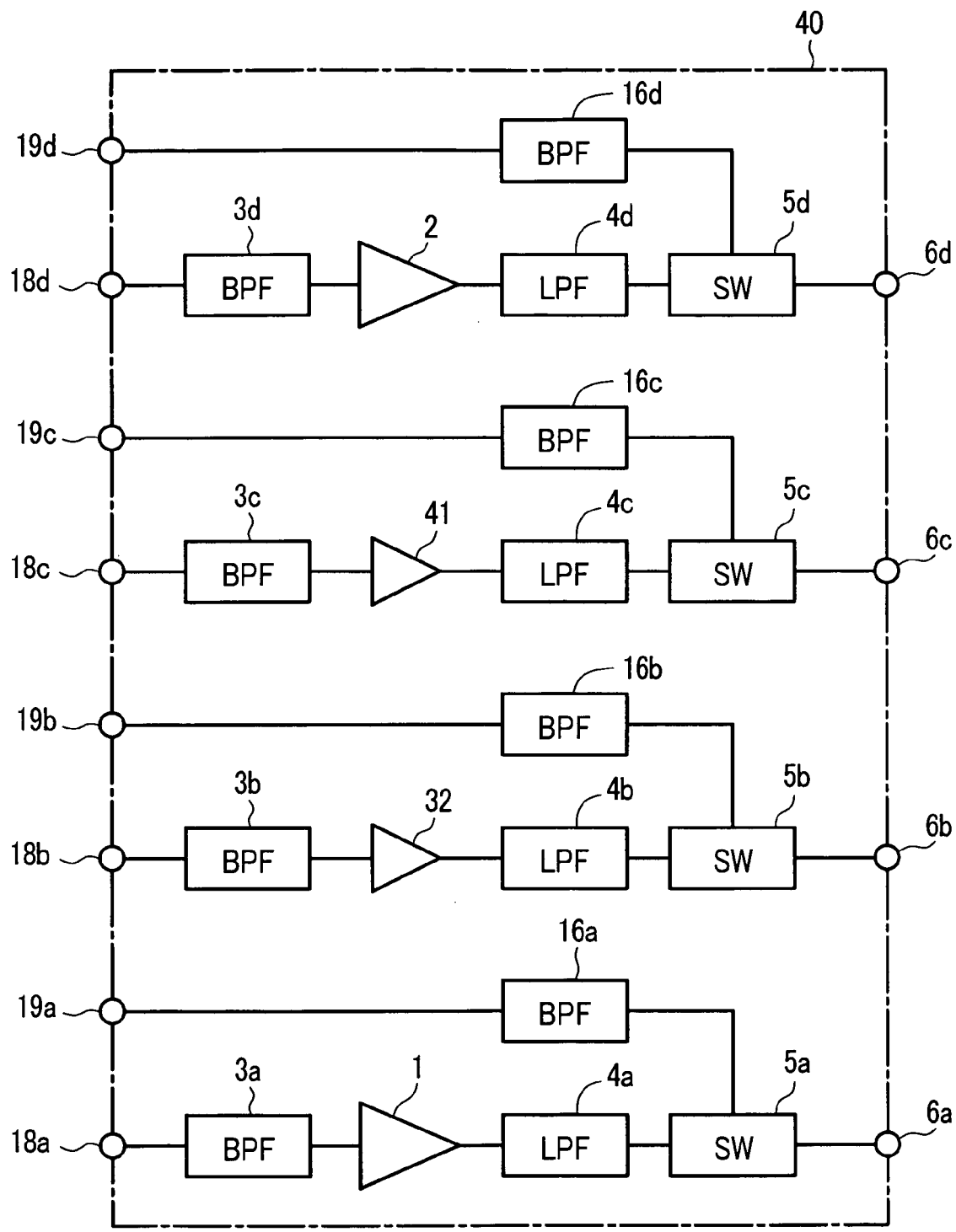
FIG. 18 is a circuit block diagram of an eighth preferred embodiment of the invention.

An eighth embodiment of the present invention will now be described with reference to FIG. 18. FIG. 18 is a block diagram showing the circuit configuration of a radio frequency module 40 for MIMO of transmission antenna-4, which operates in the 2.4-GHz band. This module comprises the first PA1, the second PA2, the third PA 32, a fourth PA41, four band pass filters 3a through 3d for the transmit signal, four low pass filters 4a through 4d for the transmit signal, four band pass filters 16a through 16d for the receive signal and four switches 5a through 5d. It is further provided with four input terminals 18a through 18d for the transmit signal, four output terminals 19a through 19d for the receive signal and four antenna terminals 6a through 6d.

Figure 19:
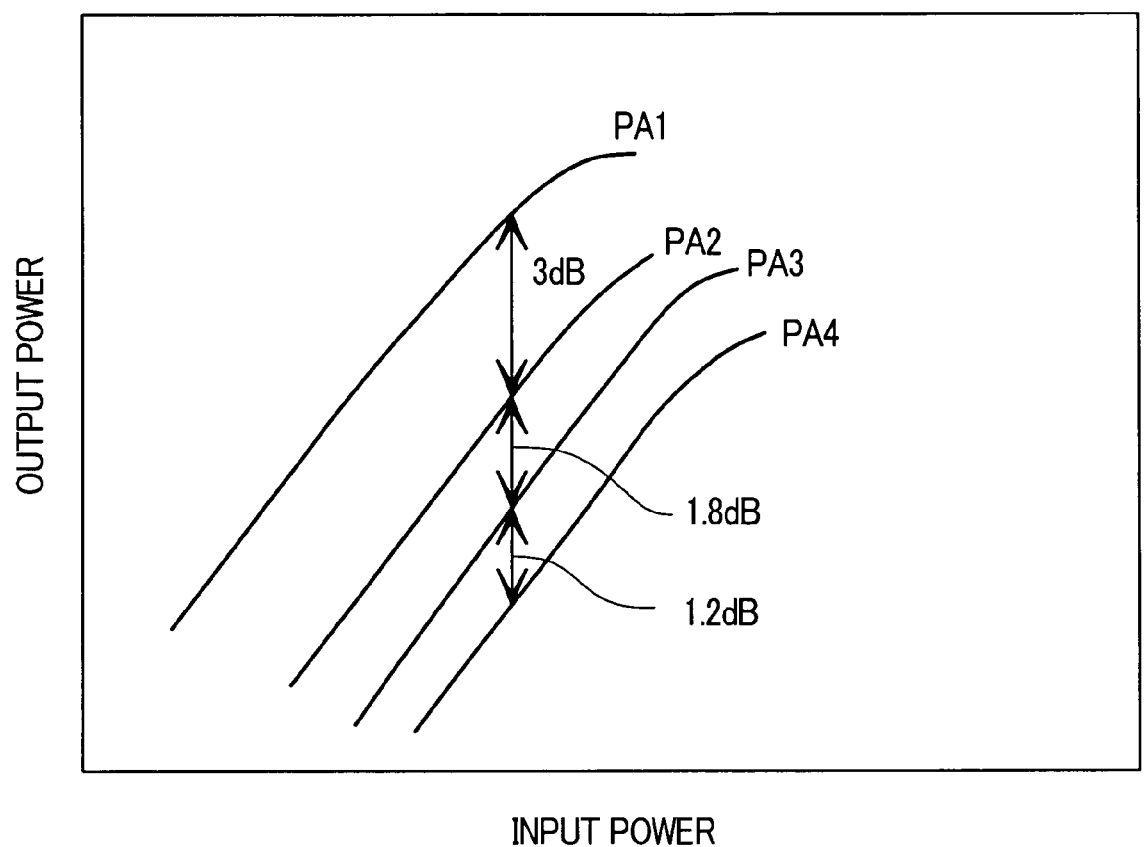
FIG. 19 shows the input-output characteristics of the power amplifiers used in the eighth embodiment.

In a MIMO system of transmission antenna-4, the transmit signal is inputted to the first PA1, the second PA2, the third PA 32 and the fourth PA41. When SISO communication is to be performed in a conventional wireless LAN environment, the transmit signal is inputted at the time of transmission only to the transmitting part containing the first PA1. And when the other party in communication is of reception antenna-2, the transmit signal is inputted at the time of transmission only to the transmitting parts which include the first PA1 and the second PA2 respectively in this embodiment. When the other party in communication is of reception antenna-3, the transmit signal is inputted at the time of transmission only to the transmitting parts which include the first PA1, the second PA2 and the third PA 32 respectively in this embodiment. These four PAs are linear amplifiers fabricated mainly of GaAs. The input-output characteristics of these four PAs are shown in FIG. 19. The output power in the linear region of the second PA2 is designed to be about 3 dB lower than that of the first PA1 when given the same input power. Also, the output power of the third PA 32 is designed to be about 1.8 dB lower than that of the second PA2 when given the same input power. Further, the output power of the fourth PA41 is designed to be about 1.2 dB lower than that of the third PA32. The first PA1 is designed to meet the conventional wireless LAN standard and to output a power which reflects consideration of the loss between the output end of the PA and the antenna.

It is evident that this embodiment provides a similar effect to MIMO of transmission antenna-2 or transmission antenna-3 described above.

Ninth Embodiment

Figure 20:
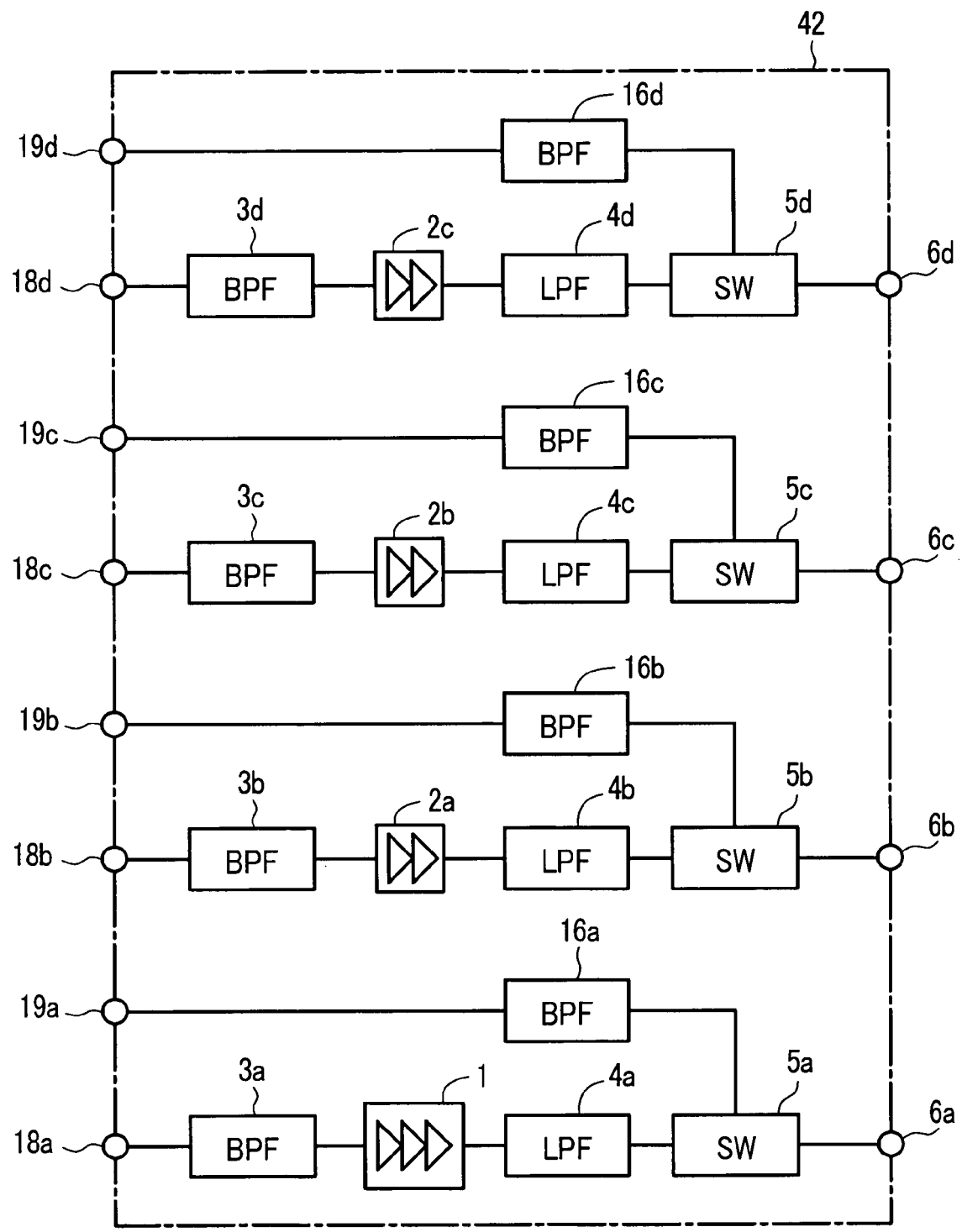
FIG. 20 is a circuit block diagram of a ninth preferred embodiment of the invention.

A ninth embodiment of the present invention will now be described with reference to FIG. 20. FIG. 20 is a block diagram showing the circuit configuration of a radio frequency module 42 for MIMO of transmission antenna-4, which operates in the 2.4-GHz band. This module comprises the first PA1, three second PA2a through PA2c, four band pass filters 3a through 3d for the transmit signal, four low pass filters 4a through 4d for the transmit signal, four band pass filters 16a through 16d for the receive signal and four switches 5a through 5d. It is further provided with four input terminals 18a through 18d for the transmit signal, four output terminals 19a through 19d for the receive signal and four antenna terminals 6a through 6d.

In this embodiment, in a MIMO system in which antenna-number is four for both transmission and reception, signals are inputted to transmitting parts containing the first PA1 and the three second PA2a through PA2c respectively. When SISO communication is to be performed in a conventional wireless LAN environment, the transmit signal is inputted at the time of transmission only to the transmitting part containing the first PA1.

Figure 21:
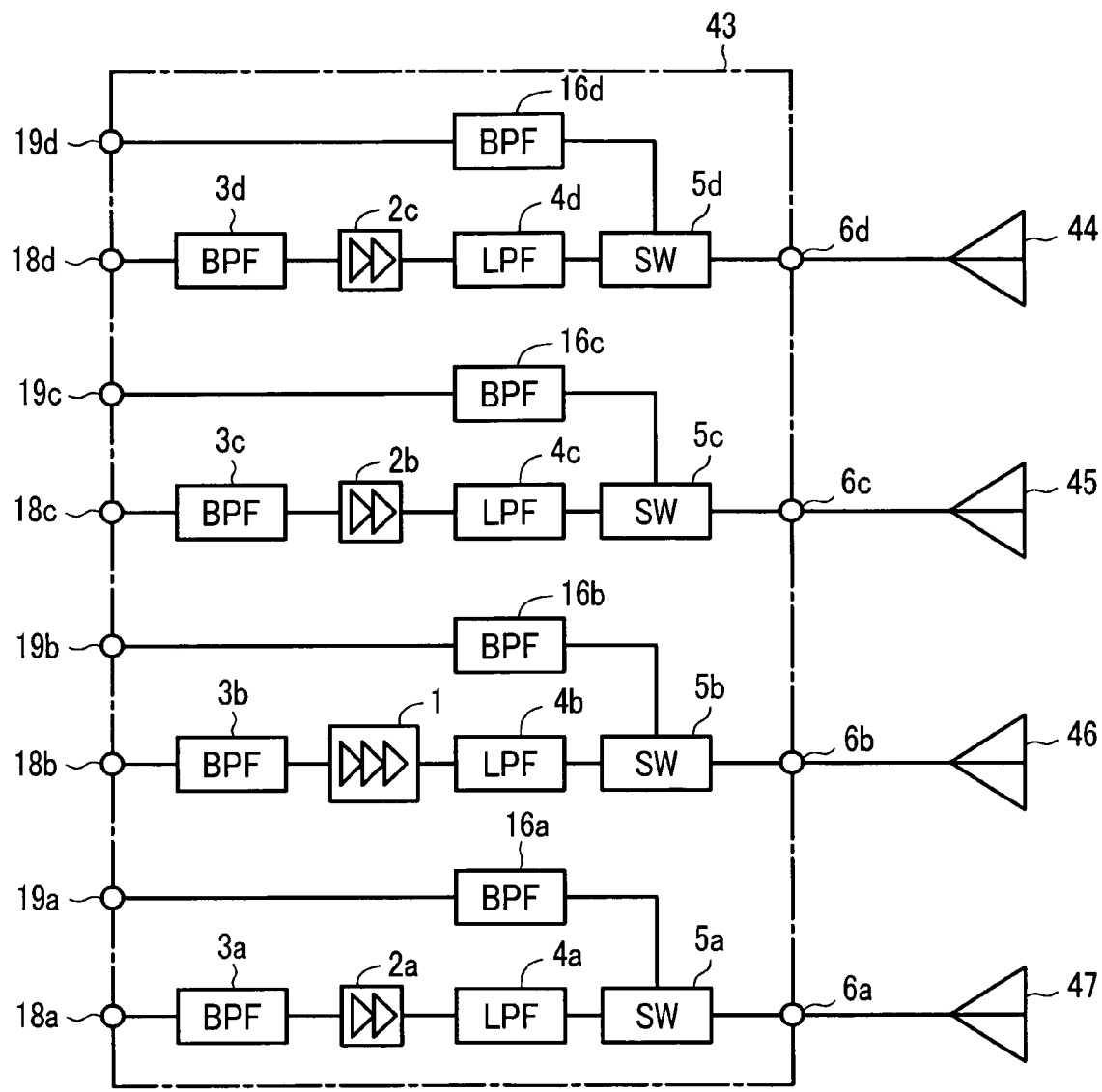
FIG. 21 is another circuit block diagram of the ninth embodiment.

On the other hand, when the other party in communication of reception antenna-2, the transmitting part containing the first PA1 is not used at the time of transmission in this embodiment unlike in the embodiments described above, but two out of the three second PA2 are used, and the transmit signal is inputted to the two transmitting parts containing the second PA2 respectively. And when the other party of reception antenna-3, the transmitting part containing the first PA1 is not used at the time of transmission, but the transmit signal is inputted to the three transmitting parts containing the second PA2 respectively. This configuration can provide a similar effect to what the seventh embodiment of the invention does. It is desirable for transmitting/receiving parts containing the second PA2a and PA2c respectively in the transmitting parts to be arranged at the two ends of a module 43 as shown in FIG. 21 and for the first PA1 whose output power is the maximum to be arranged between the second PA2a and PA2c. Like the eighth preferred embodiment, this embodiment can provide a higher MIMO effect and an effect to reduce heat generation.

10$^{th}$ Embodiment

A 10$^{th}$ embodiment of the present invention will now be described with reference to FIG. 22 through FIG. 25. In the first through ninth embodiments, the efficiencies in MIMO communication of PAs usable in both MIMO and SISO and those of PAs which may output a lower level of power, even when used in MIMO, than the optimal output power designed in advance according the number of antennas used by the other party in communication are lower than the efficiencies at the pre-designed optimal output power. The PAs used in this embodiment are so configured as to be enabled to achieve high efficiencies even when a low level power is outputted by switching the connections of transistors within the PA between the pre-designed optimal output power and a lower level of output power than that. Regarding this embodiment, description of the circuit configuration of the radio frequency module will be dispensed with, but only the configuration of the PAs will be described.

Figure 22:
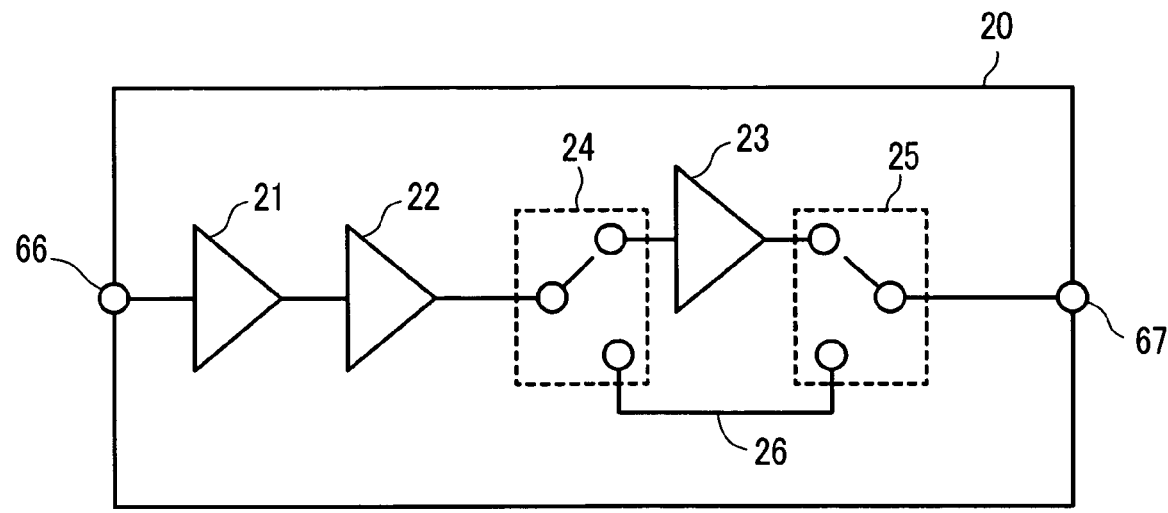
FIG. 22 is a first configurational diagram of a power amplifier for describing a $10^{th}$ preferred embodiment of the invention.

A PA 20 in this embodiment of the invention is a three-stage amplifier in which transistors are cascade-connected in three stages as shown in FIG. 22. Thus, it is a three-stage amplifier configured of a first stage 21, a second stage 22 and a third stage 23. In the PA 20 shown in FIG. 22, a switch 24 and a switch 25 are respectively disposed between the second stage 22 and the third stage 23 and between the third stage 23 and an output terminal 67. In this embodiment, the PA 20 is so designed, with the total gain of the PA 20 being supposed to be 25 dB for instance, as to set the gain ratio among three stages to 10:9:6 in that order. By configuring the PA 20 as it is in this embodiment, it is possible to form the PA which amplifies the signal by using all its three stages in SISO communication or, in MIMO communication of transmission antenna-4, is reduced in gain by 6 dB by separating the third stage with the switch 24 and the switch 25.

Figure 23:
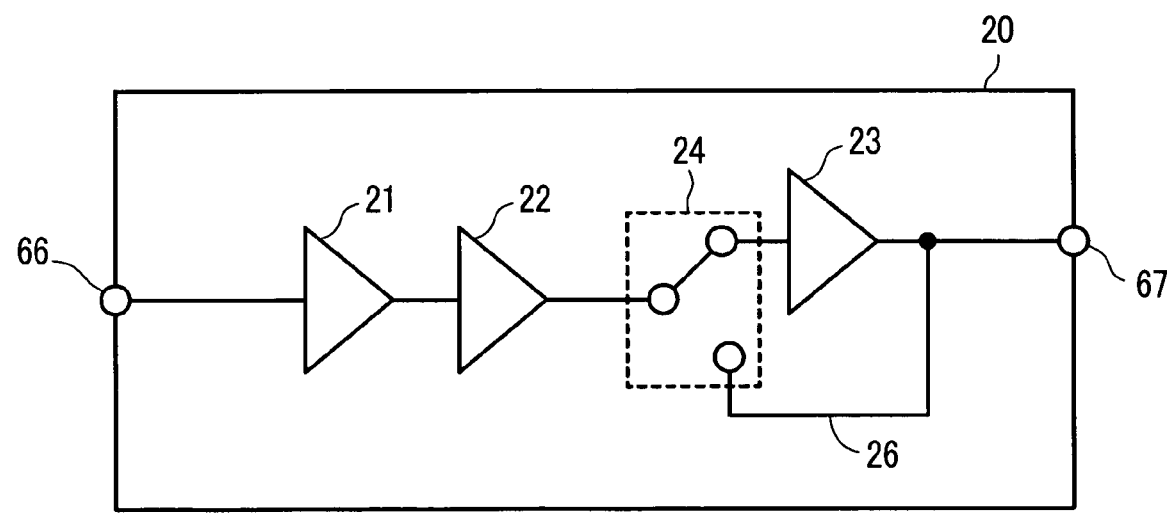
FIG. 23 is a second configurational diagram of a power amplifier for describing the $10^{th}$ embodiment.
Figure 24A:
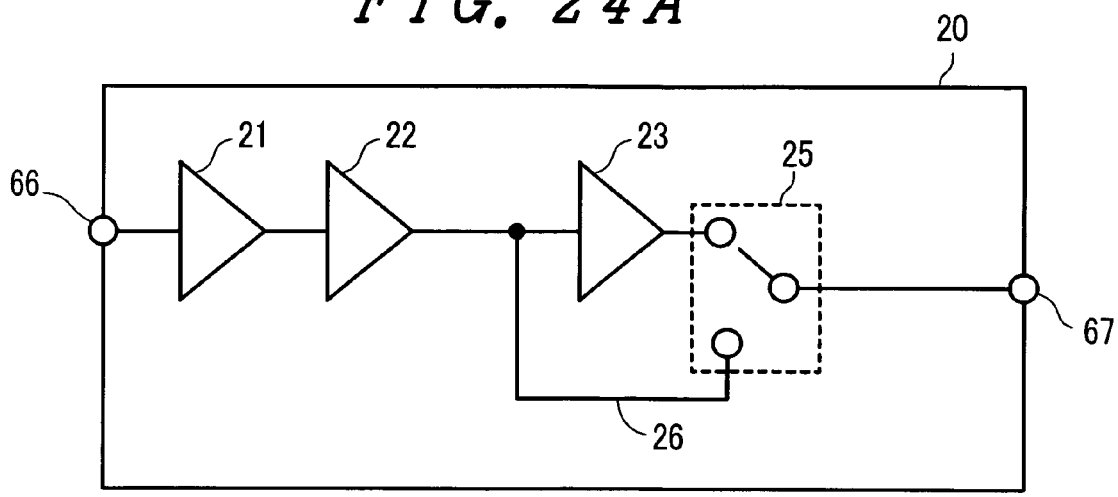
FIG. 24A is a third configurational diagram of a power amplifier for describing the $10^{th}$ embodiment.
Figure 24B:
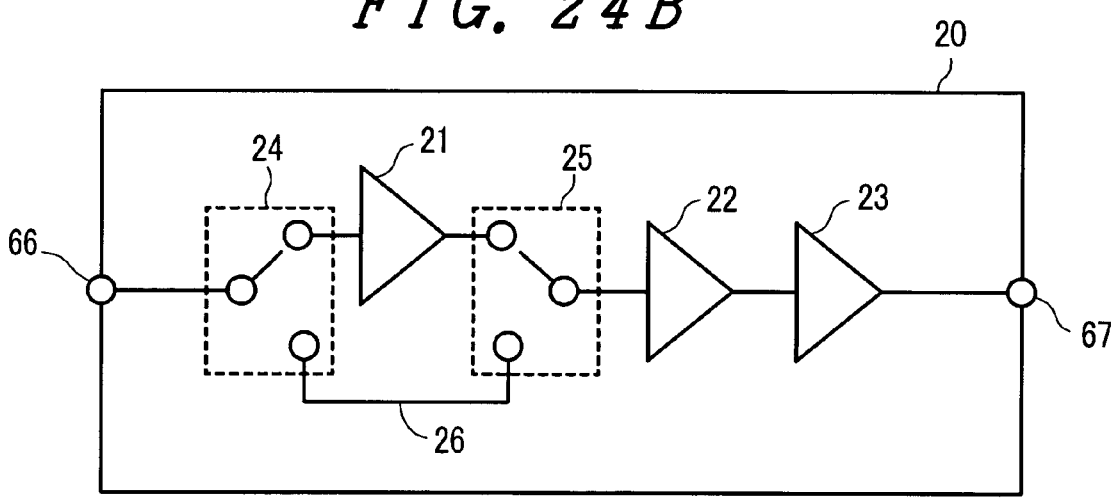
FIG. 24B is a fourth configurational diagram of a power amplifier for describing the $10^{th}$ embodiment.
Figure 24C:
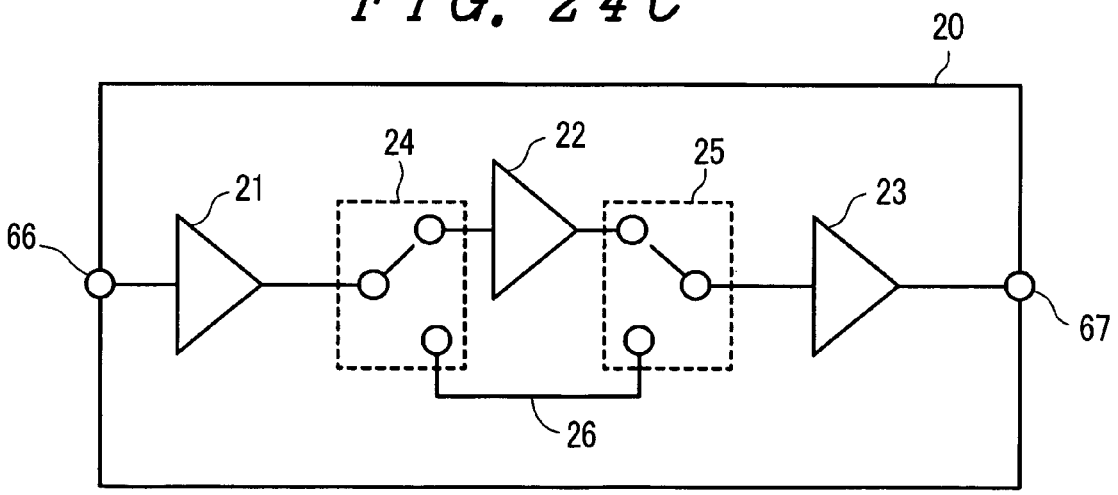
FIG. 24C is a fifth configurational diagram of a power amplifier for describing the $10^{th}$ embodiment.

Although two switches are used in the PA 20 shown in FIG. 22, it is also possible to configure the PA containing only one switch 24 or switch 25 as shown in FIG. 23 or FIG. 24A, respectively. Where the switch 24 is to be disposed between the second stage 22 and the third stage 23 as shown in FIG. 23, designing of a matching circuit which takes account of the addition of a radio frequency path 26 to the output of the third stage 23 would be required. In the configuration shown in FIG. 24A, designing of a matching circuit which takes account of the addition of the radio frequency path 26 between the stages would be needed. In the PAs shown in FIG. 22 to FIG. 24A, the transistor of the third stage is to be separated, but obviously it is also conceivable to separate the transistor of the first stage as shown in FIG. 24B or to separate the transistor of the second stage as shown in FIG. 24C.

Figure 25:
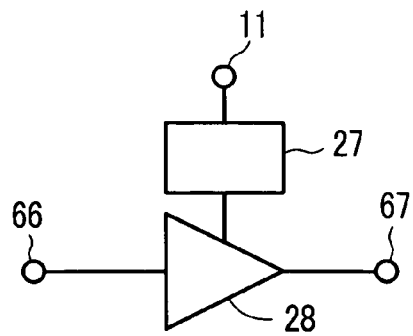
FIG. 25 is a sixth configurational diagram of a power amplifier for describing the $10^{th}$ embodiment.

Further in the PA shown in FIG. 25, a DC-DC converter 27 is provided in the biasing circuit of a PA 28 whose output power varies with the number of antennas used by the other party in communication. The bias voltage of the PA 28 is altered by the DC-DC converter 27 according to the number of antennas used by the other party in communication. It is thereby made possible to reduce power consumption by the PA 28 when a lower level of power is to be outputted.

11$^{th}$ Embodiment

Figure 26A:
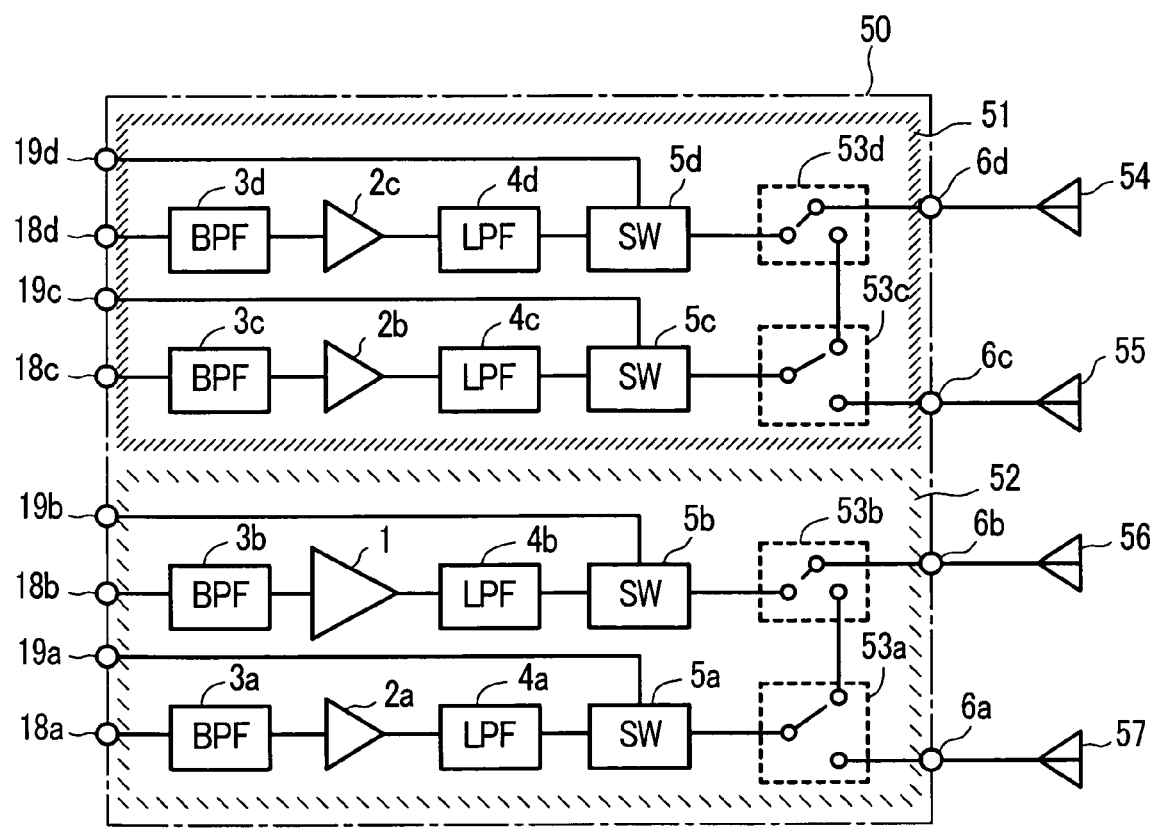
FIG. 26A is a circuit block diagram of an $11^{th}$ preferred embodiment of the invention.

An 11$^{th}$ embodiment of the present invention will now be described with reference to FIG. 26A. FIG. 26A is a block diagram showing the circuit configuration of a radio frequency module 50 for MIMO of transmission antenna-4, which operates in the 2.4-GHz band. This module comprises the first PA1, three second PA2a through PA2c, four band pass filters 3a through 3d for the transmit signal, four low pass filters 4a through 4d for the transmit signal, four switches 5a through 5d, and four more switches 53a through 53d. While the module of this embodiment can be used in the same way as the ninth embodiment described with reference to FIG. 20, the difference between this embodiment and the ninth embodiment consists in that the radio frequency module of this embodiment is provided with the four switches 53a through 53d for switching the antennas to which PAs are to be electrically connected.

Figure 26B:
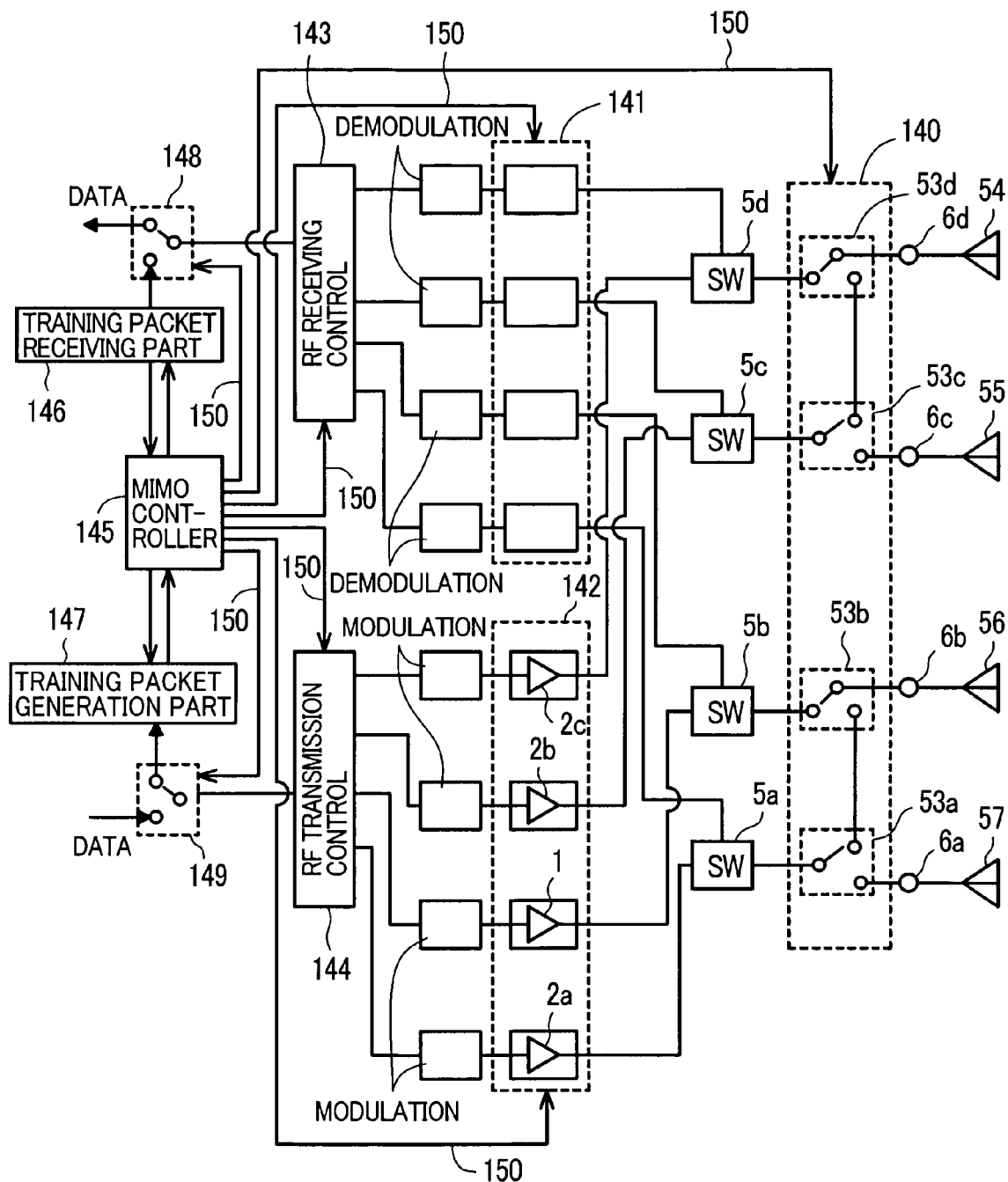
FIG. 26B is a functional block diagram of a radio communication apparatus for describing the $11^{th}$ embodiment.

A functional block diagram of a radio communication apparatus using the radio frequency circuit module of this embodiment is shown as FIG. 26B. In the radio communication apparatus configured by using this embodiment, information, for instance its own number of antennas, the modulation method by which it can communication and other items of information needed for communication with the other party is transmitted by a training packet generation part 147 to another radio communication apparatus which constitutes the other party in communication. Similar information from the other party's radio communication apparatus is received by a training packet receiving parts 146, and the bit error rate is measure. By this exchange of information with the radio communication apparatus constituting the other party, the other party's number of antennas is determined, and a MIMO controller 145 makes a comprehensive decision regarding the optimal method of communication with the radio communication apparatus. On the basis of the result of that decision, the MIMO controller 145 controls an RF transmission control 144, an RF receiving control 143, an RF transmission part 142 and an RF receiving part 141 with a control signal 150, and controls its own number of antennas. Whereas these transmission and reception of a training packet are performed regularly, the first training packet transmission and reception after power supply to the radio communication apparatus is performed by SISO communication. After that, it is done either by SISO communication or by the communication method used when a packet was sent last time.

Where the other party with whom a radio communication apparatus configured by using the radio frequency module 50 represented by this embodiment performs communication is of reception antenna-2, the radio communication apparatus configured by using the radio frequency module 50 represented by this embodiment should be of transmission antenna-2. The four transmitting/receiving parts which the radio frequency module 50 is provided with are used as divided into two sets including a constituent element part 51 and a constituent element part 52 as shown in FIG. 26A. Then, the switches 53d and 53c are provided on the constituent element part 51 side and the switches 53a and 53b on the constituent element part 52 side.

As a result of configuring the radio frequency module 50 in this way, where the other party's radio communication apparatus is of reception antenna-2, the transmit signal is inputted to the amplifiers of the second PA2a and the second PA2b of the radio frequency module of this embodiment. Then, the switches 53a and 53b are so changed over as to cause the signal from the second PA2a to be transmitted from either an antenna 56 or an antenna 57. Also, the switches 53c and 53d are so changed over as to cause the signal from the second PA2b to be transmitted from either an antenna 54 or an antenna 55. The control of these switches 53a, 53b, 53c and 53d is accomplished with the control signal 150 sent by the MIMO controller 145 to a switch part 140. When the bit error rate of the regular transmission/reception of the training packet or the bit error rate of in usual data transmission surpasses a preset threshold, the switches 53a, 53b, 53c and 53d are changed over. If the change-over of the switches 53a, 53b, 53c and 53d does not invite further worsening of the bit error rate, communication will be performed in a state in which the switches 53a, 53b, 53c and 53d have been changed over, namely in a state in which the antennas for use in communication have been altered. By changing over the switches 53a, 53b, 53c and 53d in this way, transmission diversity which allows communication under more favorable conditions of propagation to be performed is realized. Since the radio frequency module of this embodiment also includes receiving parts, reception diversity can be realized, too. Thus, the radio frequency module of this embodiment is equipped with switches for changing over the antennas to which the second PA2a and the second PA2b are to be electrically connected, with result that communication with the other party can be accomplished under more favorable conditions of communication. Although this embodiment has been described with reference to a radio frequency module form, the same holds true with a radio frequency circuit apparatus which is not formed as a module. This embodiment can provide a similar effect even if the number of antennas used by the other party in communication is not two, if only the number is less than four.

Figure 27:
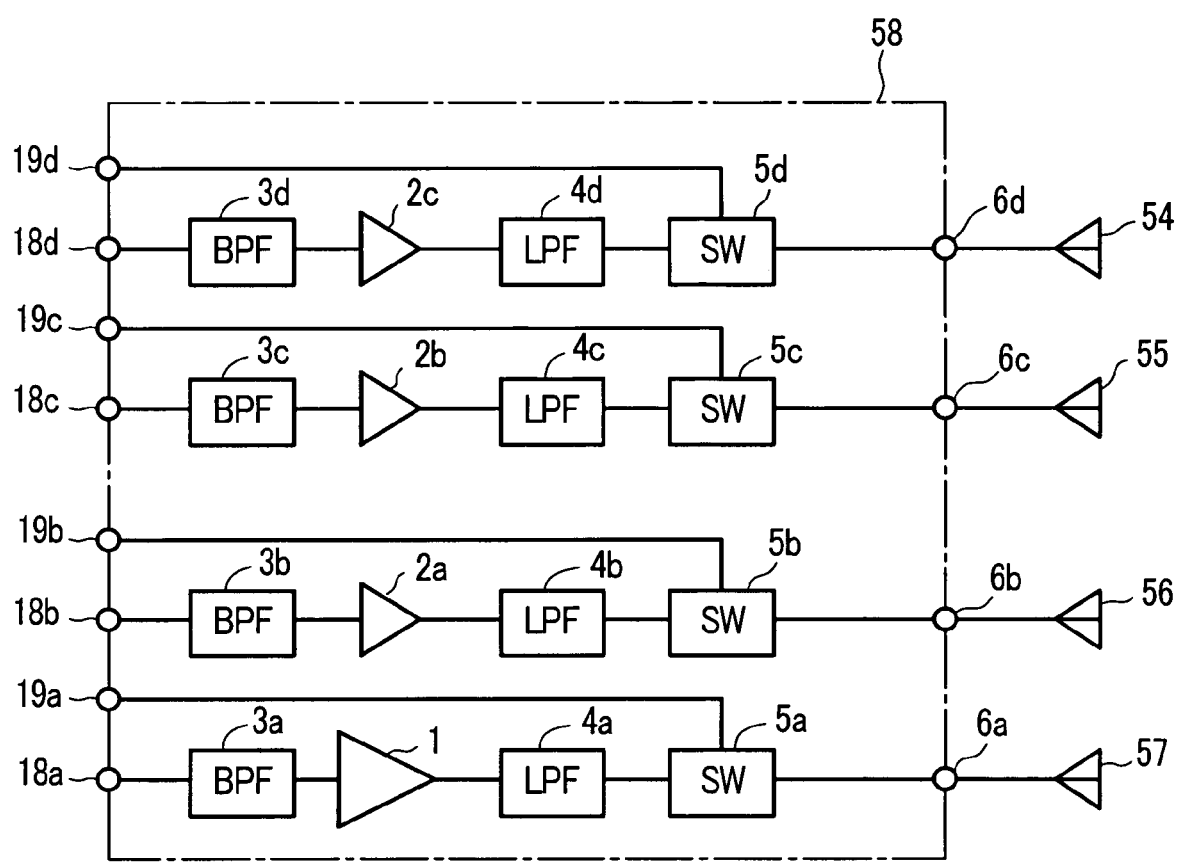
FIG. 27 is another circuit block diagram for describing the $11^{th}$ embodiment.

Although the embodiment shown in FIG. 26A realizes antenna diversity in which only antennas are changed over, a transmission diversity effect can also be achieved by using all the transmitting parts of a radio frequency module 58 for MIMO use as shown in FIG. 27. In this case, the diversity effect is realized as, for instance, the control signal from the MIMO controller 145 is received by the RF transmission control shown in FIG. 26B and data mutually differing in code are transmitted from the antennas 54 through 57.

$12^{th}$ Embodiment

Figure 28:
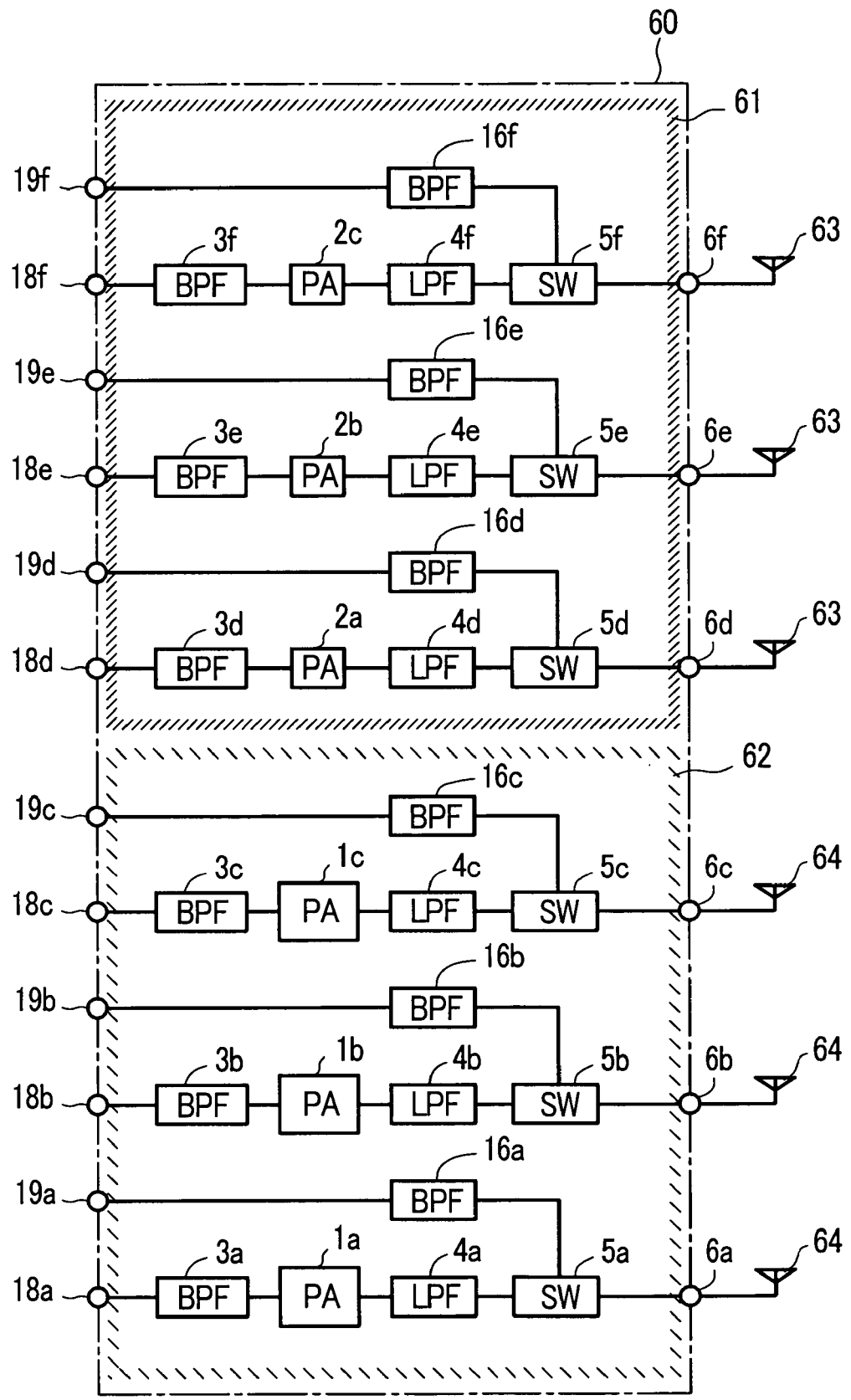
FIG. 28 is a circuit block diagram for describing a $12^{th}$ preferred embodiment of the invention.

A $12^{th}$ embodiment of the present invention will now be described with reference to FIG. 28. FIG. 28 is a block diagram showing the circuit configuration of a radio frequency module 60 for MIMO of transmission antenna-2. This module comprise three first PA1a through PA1c, three second PA2a through PA2c, six band pass filters 3a through 3f for the transmit signal, six low pass filters 4a through 4f for the transmit signal, six switches 5a through 5f, and in addition six band pass filters 16a through 16f for the receive signal.

This embodiment is divided into two sets including a constituent element part 61 of the radio frequency module for MIMO use and a constituent element part 62 of the radio frequency module for MIMO use according to the type of PAs used, and the beam shape of antennas is determined in each set. In other words, it has a configuration permitting beam forming. Antenna beam forming makes possible communication in a more favorable state. Since the functional blocks of the radio communication apparatus of this embodiment are substantially the same as those shown in FIG. 26B, the following description will refer to FIG. 26B. The RF transmission control part determines with the control signal 150 from the MIMO controller 145 the amplitude and phase of the transmit signal to be inputted to each transmitting part and performs antenna beam forming.

$13^{th}$ Embodiment

Figure 29:
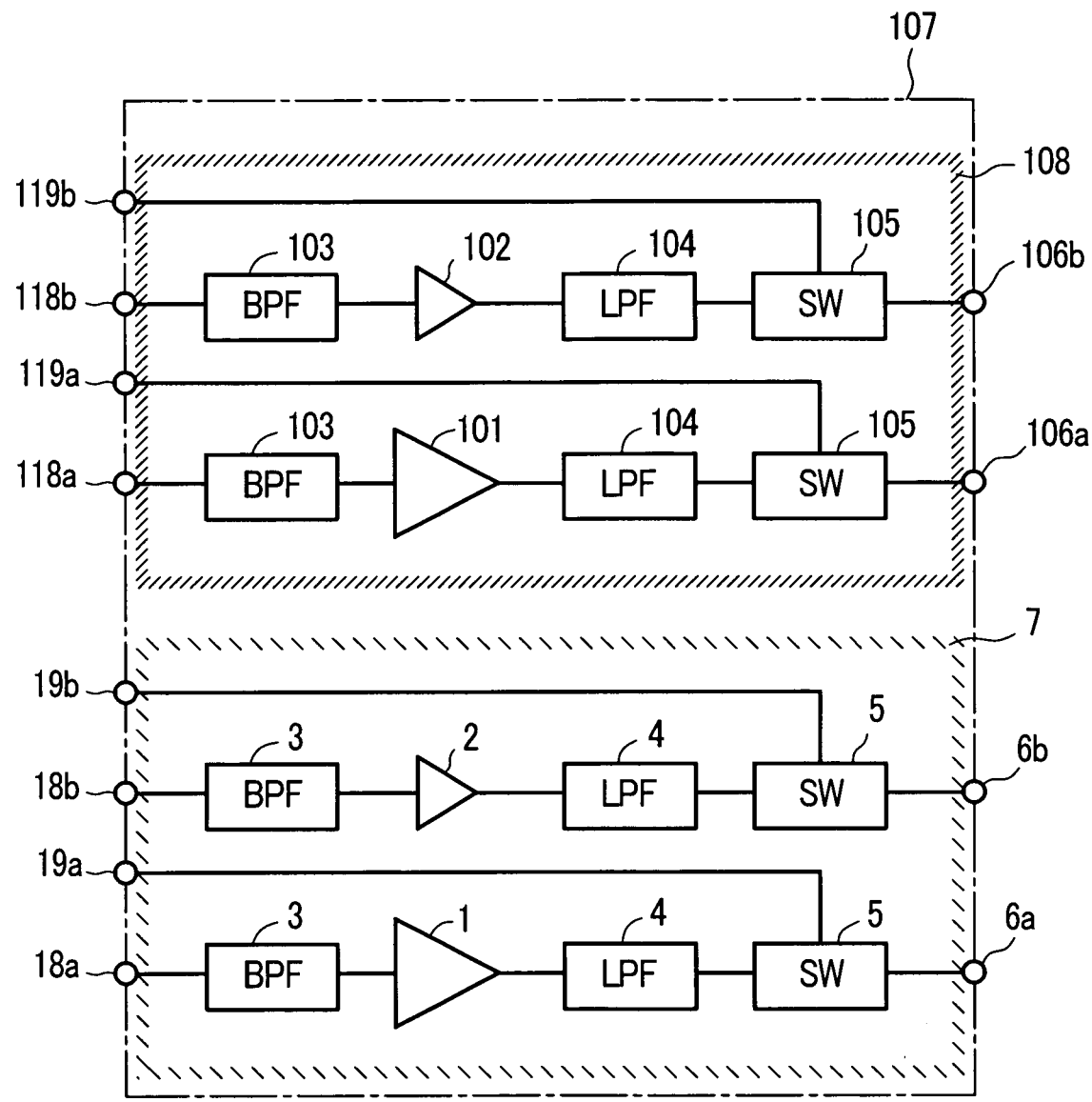
FIG. 29 is another circuit block diagram for describing a 13th preferred embodiment of the invention.

A $13^{th}$ embodiment of the present invention will now be described with reference to FIG. 29. FIG. 29 is a block diagram showing the circuit configuration of a radio frequency module 107 for MIMO of transmission antenna-2, which operates both in the 2.4-GHz band and in the 5-GHz band. In this embodiment, the radio frequency module 107 is configured by combining a radio frequency module 7 for MIMO to operate in the 2.4-GHz band and a radio frequency module 108 for MIMO to operate in the 5-GHz band. The use of the radio frequency module 107 of such a configuration makes it possible to readily realize a wireless LAN card with dual band MIMO.

Figure 30:
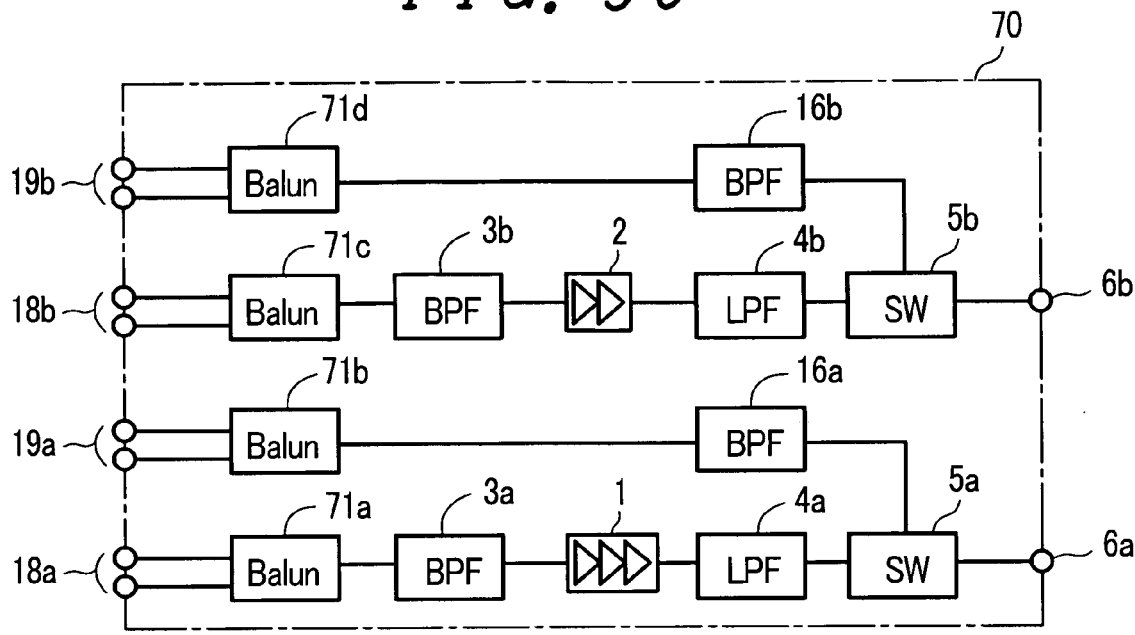
FIG. 30 is a circuit block diagram for describing another first circuit configuration in the first through 13th embodiments.
Figure 31:
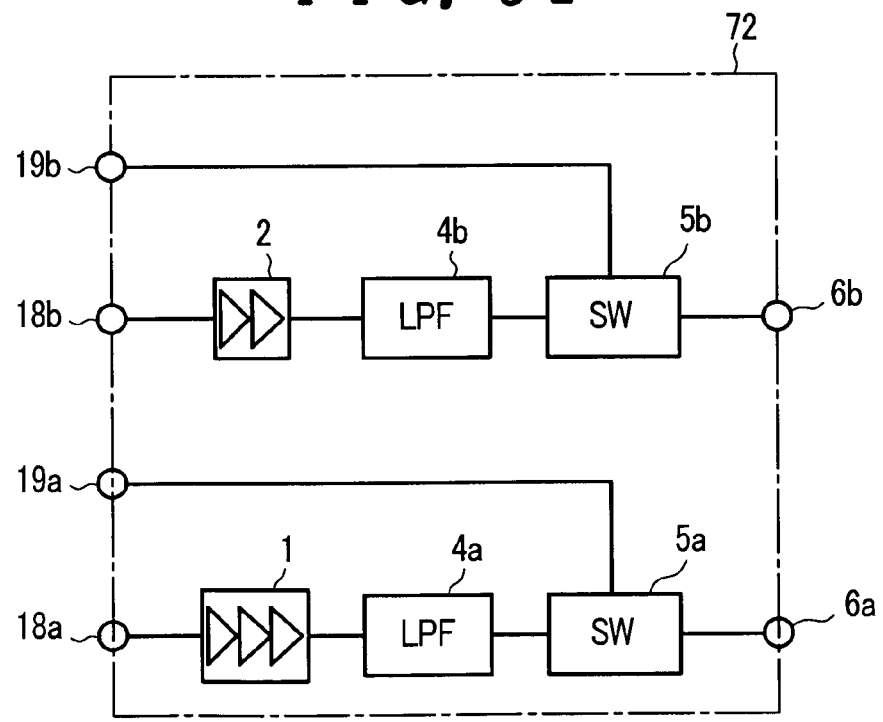
FIG. 31 is a circuit block diagram for describing another second circuit configuration in the first through 13th embodiments.
Figure 32:
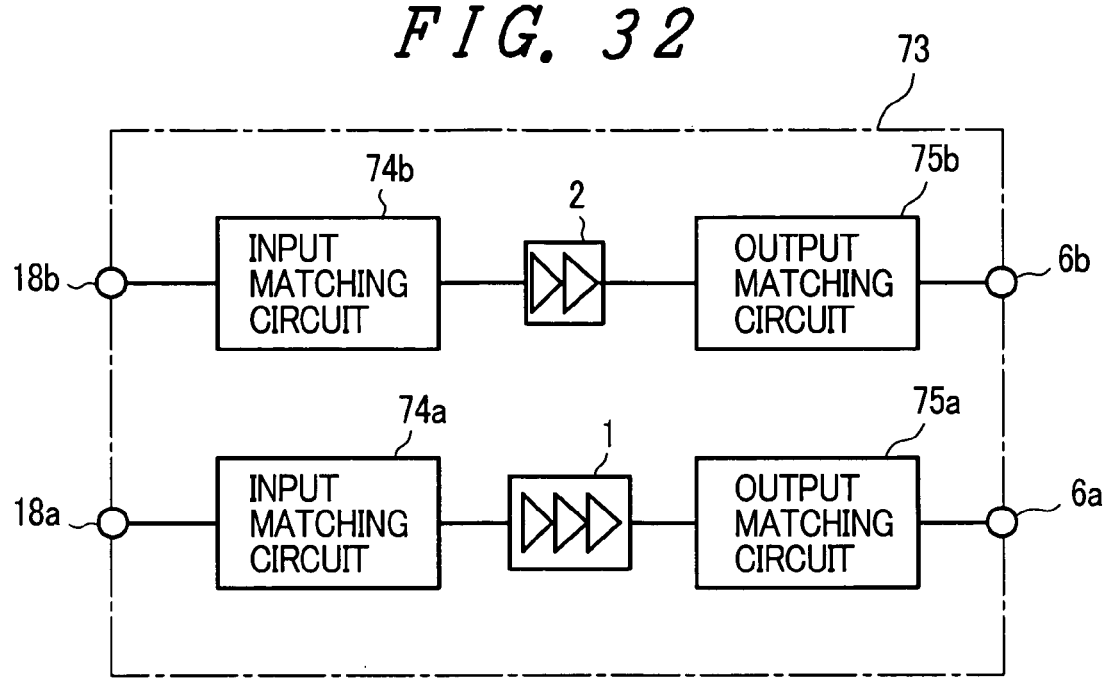
FIG. 32 is a circuit block diagram for describing another third circuit configuration in the first through 13th embodiments.

Although radio frequency circuit apparatuses and radio frequency modules embodying the present invention have been described so far, obviously the circuit configuration in each preferred embodiment is not limited to what has been described within the scope of not deviating from the essentials of the invention. For instance, a radio frequency module 70 for MIMO use shown in FIG. 30 has a configuration in which baluns 71a, 71b, 71c and 71d in the transmission path and the reception path are added to the radio frequency module for MIMO use described as the second embodiment or otherwise. And a radio frequency module 72 for MIMO use shown in FIG. 31 has a configuration in which band pass filters are removed from the radio frequency module 17 described as the first preferred embodiment. Or a radio frequency module 73 for MIMO use shown in FIG. 32 is configured only of the first PA1 and the second PA2 together with input matching circuits 74a and 74b and output matching circuits 75a and 75b for the PAs.

It is also evident that even a radio frequency circuit apparatus or a radio frequency module formed only of transmitting parts can provide the advantages of the present invention. Obviously any radio frequency circuit apparatus or radio frequency module according to the invention may be so configured as to have the functions of an RF-IC and a baseband part. The frequency bands are not limited to those described with reference to these embodiments, and other frequency bands can evidently provide similar effects unless the essentials of the invention are not deviated from.

The main materials for the PAs are not limited to GaAs and Si, but SiGe and InGaP can also be used. The PAs may as well be formed through a mixture of a number of processes, and their structure obviously is not limited to any specific one if only it has a function to amplify the signal.

Furthermore, it is evident that the number of antennas for transmission and reception, the types of PAs, the gain and the relationships among the output power levels of the plurality of PAs are not limited to those described with reference to the preferred embodiments, but any values suitable for a given purpose without deviating from the essentials of the invention can be used.

14$^{th}$ Embodiment

Figure 33:
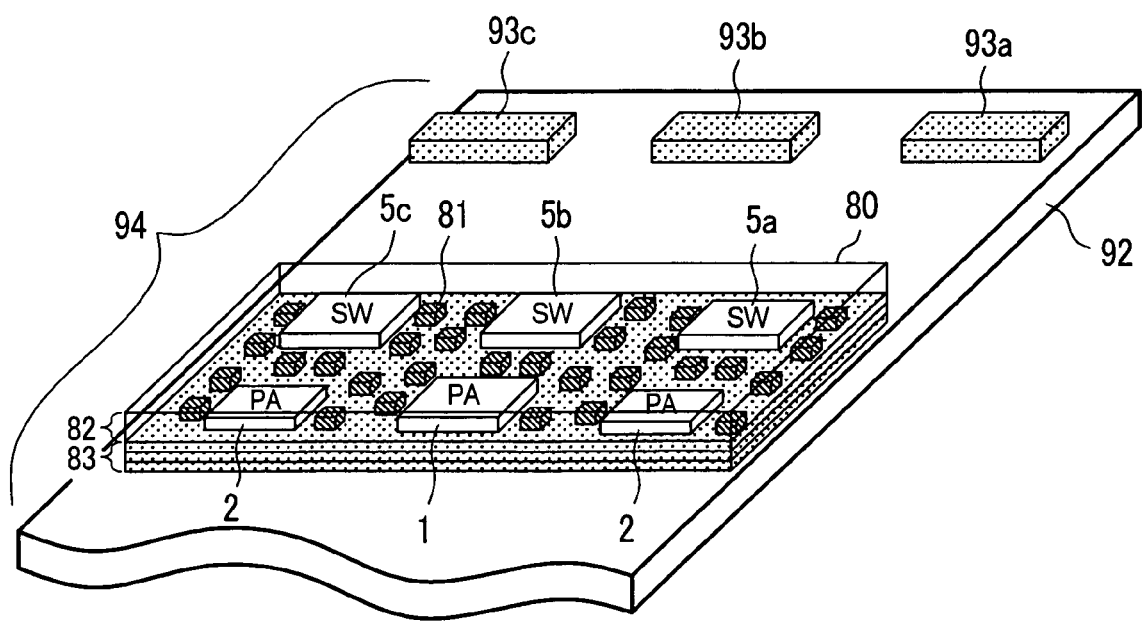
FIG. 33 is a perspective view for describing a 14th preferred embodiment of the invention.
Figure 34:
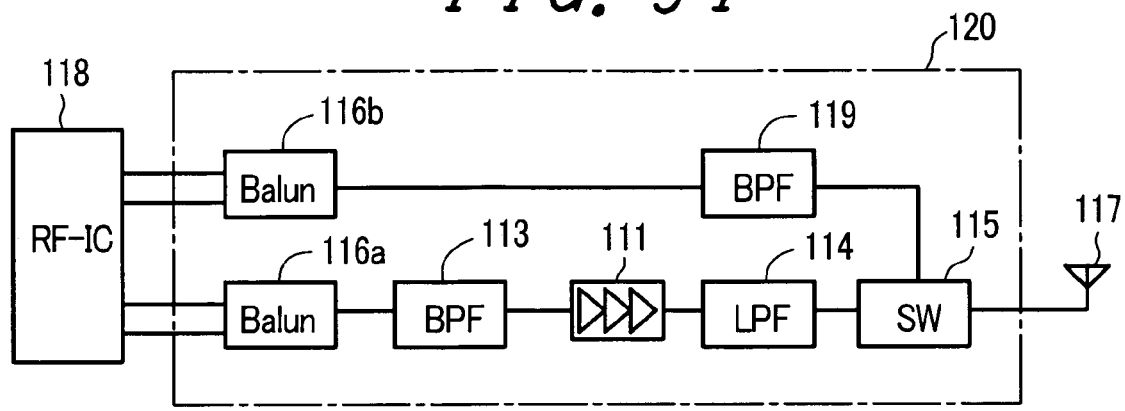
FIG. 34 is a circuit configuration diagram for describing a conventional radio frequency circuit.
Figure 35:
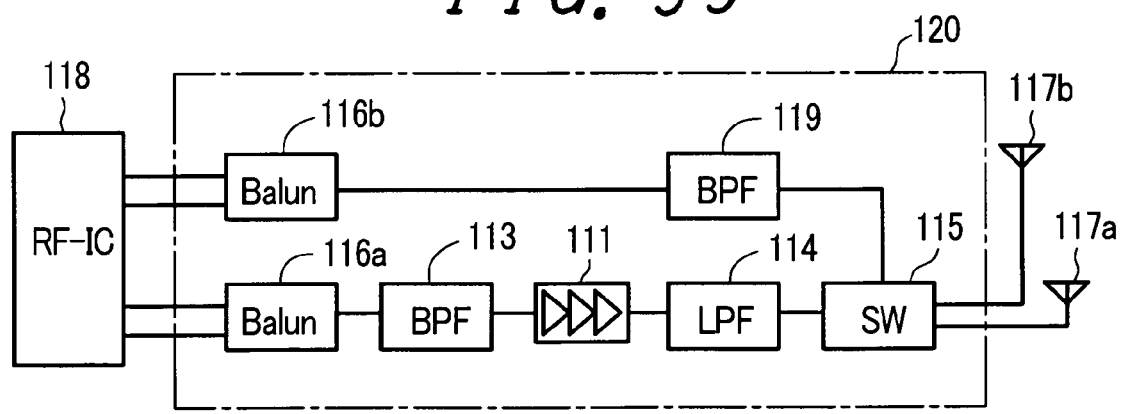
FIG. 35 is a circuit configuration diagram for describing another conventional radio frequency circuit.
Figure 36:
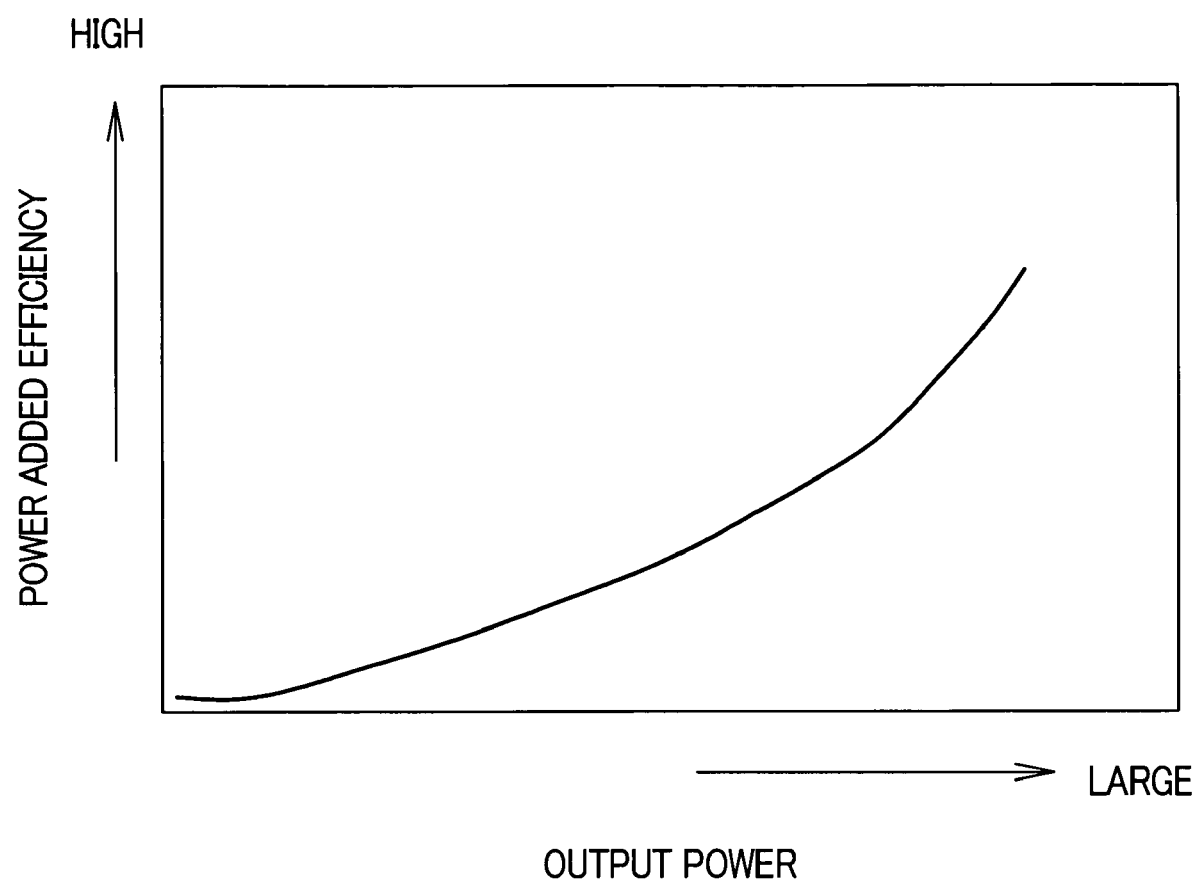
FIG. 36 shows the output power-dependence of the power added efficiency of the power amplifiers used in a conventional radio frequency circuit.

A 14$^{th}$ embodiment of the present invention will now be described with reference to FIG. 33. FIG. 33 shows a wireless LAN module 94 whose configuration includes the radio frequency module 80 fabricated by using the ceramic substrate 83. The radio frequency module 80 and ceramic antennas 93a, 93b and 93c are mounted over a resin substrate which serves as the mother board. By using any of the above-described radio frequency modules (e.g. the radio frequency module 37 shown in FIG. 16) according to the invention as the radio frequency module 80 according to the invention, it is made possible to realize a wireless LAN module whose drop in power amplifier efficiency is restrained.

Incidentally, this wireless LAN modules are supposed to use ceramic antennas, antennas of any material can evidently be used if only they can transmit and receive electric waves of desired frequencies.

According to the present invention, at least one of plurality of PAs used in MIMO communication has an appropriate level of output power for MIMO specifications, and the PA is used in MIMO communication. Therefore, the overall efficiency drop of the plurality of PAs is restrained.

It is further understood by those skilled in the art that the foregoing description is a preferred embodiment of the disclosed device and that various changes and modifications may be made in the invention without departing from the spirit and scope thereof.

What is claimed is:

1. A radio frequency circuit apparatus comprising:
    a plurality of power amplifiers for amplifying a transmit signal,
    wherein said plurality of power amplifiers include at least two power amplifiers differing in maximum output power from each other, and
    wherein at least one out of said plurality of power amplifiers is used according to a communication system,
    wherein one out of said plurality of power amplifiers is used by itself for the transmit signal when said radio frequency circuit apparatus operates in a prescribed communication system, and said one power amplifier that is used by itself gives the largest maximum output power among said plurality of power amplifiers, and
    wherein said one power amplifier, when said radio frequency circuit apparatus operates in the other communication system than said prescribed communication system, is used together with at least one other power amplifier out of said plurality of power amplifiers for the transmit signal, and
    wherein the number of amplifying stages of said one power amplifier differs between a case in which said one power amplifier is used by itself and a case in which said one power amplifier is used together with said at least one other power amplifier.

2. The radio frequency circuit apparatus according to claim 1,
    wherein at least two other power amplifiers out of said at least one other power amplifiers are used together with said one power amplifier, and
    wherein said at least two other power amplifiers include two power amplifiers which are substantially equal in size.

3. The radio frequency circuit apparatus according to claim 1,
    wherein said plurality of power amplifiers are used for amplifying signals at least part of whose frequency band is equal.

4. The radio frequency circuit apparatus according to claim 1,
    wherein said radio frequency circuit apparatus's own communication system is controlled according to the communication system of the other radio frequency circuit apparatus receiving said transmit signal.

5. The radio frequency circuit apparatus according to claim 1,
    wherein when at least two out of said plurality of power amplifiers are used according to the communication system, at least one of said at least two power amplifiers is reduced in the number of amplifying stages so as to bring down the maximum output power thereof.

6. The radio frequency circuit apparatus according to claim 1,
    wherein said radio frequency circuit apparatus is further provided with a plurality of terminals for electrically connecting a plurality of antennas to said plurality of power amplifiers in one-to-one correspondence, and said plurality of power amplifiers are respectively connected electrically to said plurality of terminals.

7. The radio frequency circuit apparatus according to claim 6,
    wherein said radio frequency circuit apparatus is further provided with a substrate whose plan constitutes a rectangular shape having four sides, and all of said plurality of terminals are arranged along one of said four sides of said substrate.

8. The radio frequency circuit apparatus according to claim 7,
    wherein at least two of said plurality of power amplifiers are used for the transmit signal when said radio frequency circuit apparatus operates in the other communication system than said prescribed communication system, and
    wherein said at least two power amplifiers are power amplifiers electrically connected to at least two terminals so selected out of said plurality of terminals as to maximize the average distance between terminals.

9. The radio frequency circuit apparatus according to claim 7, wherein at least one power amplifier other than two power amplifiers respectively connected to the two terminals closest to the two ends of said one side of said substrate out of said plurality of terminals is larger in size than said two power amplifiers.

10. A radio frequency circuit apparatus comprising:
a plurality of power amplifiers for amplifying a transmit signal,
wherein said plurality of power amplifiers include at least two power amplifiers differing in maximum output power from each other, and
wherein at least one out of said plurality of power amplifiers is used according to a communication system,
wherein one out of said plurality of power amplifiers is used by itself for the transmit signal when said radio frequency circuit apparatus operates in a prescribed communication system, and said one power amplifier that is used by itself gives the largest maximum output power among said plurality of power amplifiers, and
wherein at least two other power amplifiers out of said plurality of power amplifiers are used for the transmit signal when said radio frequency circuit apparatus operates in the other communication system than said prescribed communication system.

11. The radio frequency circuit apparatus according to claim 10, wherein said one power amplifier is turned off when said radio frequency circuit apparatus operates in the other communication system than said prescribed communication system.

12. The radio frequency circuit apparatus according to claim 10, wherein any two out of said at least two other power amplifiers are substantially equal in size.

13. A radio frequency circuit apparatus comprising:
a plurality of power amplifiers for amplifying a transmit signal,
wherein said plurality of power amplifiers include at least two power amplifiers differing in maximum output power from each other, and
wherein at least one out of said plurality of power amplifiers is used according to a communication system,
wherein one out of said plurality of power amplifiers is used by itself for the transmit signal when said radio frequency circuit apparatus operates in a prescribed communication system, and said one power amplifier that is used by itself gives the largest maximum output power among said plurality of power amplifiers, and
wherein said at least two power amplifiers differing in maximum output power from each other differ in power amplifier size from each other.

* * * * *